United States Patent
Bouche et al.

(10) Patent No.: US 10,043,703 B2
(45) Date of Patent: Aug. 7, 2018

(54) APPARATUS AND METHOD FOR FORMING INTERCONNECTION LINES HAVING VARIABLE PITCH AND VARIABLE WIDTHS

(71) Applicant: GLOBALFOUNDRIES Inc., Grand Cayman (KY)

(72) Inventors: Guillaume Bouche, Albany, NY (US); Nicholas Vincent Licausi, Watervliet, NY (US)

(73) Assignee: GLOBALFOUNDRIES Inc., Grand Cayman (KR)

( * ) Notice: Subject to any disclaimer, the term of this patent is extended or adjusted under 35 U.S.C. 154(b) by 0 days.

(21) Appl. No.: 15/379,605

(22) Filed: Dec. 15, 2016

(65) Prior Publication Data

US 2018/0174894 A1  Jun. 21, 2018

(51) Int. Cl.
*H01L 23/528* (2006.01)
*H01L 23/522* (2006.01)
(Continued)

(52) U.S. Cl.
CPC ...... *H01L 21/76816* (2013.01); *H01L 21/302* (2013.01); *H01L 21/308* (2013.01); *H01L 21/76877* (2013.01); *H01L 23/528* (2013.01); *H01L 23/5226* (2013.01); *H01L 23/5286* (2013.01); *H01L 23/53209* (2013.01);
(Continued)

(58) Field of Classification Search
CPC ............... H01L 23/5226; H01L 23/528; H01L 23/5286; H01L 23/52309; H01L 23/53228; H01L 23/53242; H01L 23/53257; H01L 21/76816; H01L 21/76877; H01L 21/302; H01L 21/308; H01L 21/44; H01L 21/768

USPC ........... 257/622, 758, 774, E23.01, E23.145, 257/E21.215, E21.249, E21.24, E21.259, 257/E21.295, E21.579; 438/283, 669, 438/696, 703
See application file for complete search history.

(56) References Cited

U.S. PATENT DOCUMENTS 2,016,026 A * 10/1935 Shinkle .................. C08G 61/02
                                                       525/416
6,455,436 B1   9/2002 Ueda et al.
(Continued)

OTHER PUBLICATIONS

U.S. Appl. No. 15/077,384, filed Mar. 22, 2016.
(Continued)

*Primary Examiner* — Dao H Nguyen
(74) *Attorney, Agent, or Firm* — Heslin Rothenberg Farley & Mesiti P.C.; Stephen P. Scuderi

(57) ABSTRACT

A semiconductor cell includes a dielectric layer. An array of at least four parallel metal lines is disposed within the dielectric layer, the metal lines having line widths that are substantially equal to or greater than a predetermined minimum line width. Line spacers are disposed between the metal lines, the line spacers having line spacer widths that are substantially equal to or greater than a predetermined minimum line spacer width. An overall cell height of the cell is substantially equal to an integer multiple of a plurality of cell tracks, each cell track being a minimum pitch of the cell. The minimum pitch being defined by the minimum line width plus the minimum line spacer width. The minimum pitch is equal to or less than 36 nm. Not all of the line widths are substantially equal and every other line spacer width is substantially equal.

8 Claims, 30 Drawing Sheets

(51) Int. Cl.
*H01L 21/768* (2006.01)
*H01L 21/033* (2006.01)
*H01L 23/532* (2006.01)
*H01L 21/302* (2006.01)
*H01L 21/308* (2006.01)

(52) U.S. Cl.
CPC .. *H01L 23/53228* (2013.01); *H01L 23/53242* (2013.01); *H01L 23/53257* (2013.01)

(56) References Cited

U.S. PATENT DOCUMENTS

| | | | |
|---|---|---|---|
| 7,183,142 | B2 | 2/2007 | Anderson et al. |
| 8,298,943 | B1 | 10/2012 | Arnold et al. |
| 8,518,824 | B2 | 8/2013 | Arnold et al. |
| 8,999,848 | B2 | 4/2015 | Lee et al. |
| 9,012,287 | B2 | 4/2015 | Liaw |
| 9,123,656 | B1 | 9/2015 | Hsieh et al. |
| 9,136,106 | B2 | 9/2015 | Wu et al. |
| 9,209,279 | B1 | 12/2015 | Zhang et al. |
| 9,406,775 | B1 | 8/2016 | Bouche et al. |
| 9,786,554 | B1 | 10/2017 | Burns et al. |
| 9,812,351 | B1 * | 11/2017 | Licausi ............ H01L 21/76816 |
| 9,852,986 | B1 | 12/2017 | Stephens et al. |
| 9,881,794 | B1 | 1/2018 | Su |
| 2005/0215040 | A1 | 9/2005 | Doyle |
| 2006/0055045 | A1 | 3/2006 | Park et al. |
| 2008/0193658 | A1 | 8/2008 | Millward |
| 2008/0227298 | A1 | 9/2008 | Hirota |
| 2011/0240596 | A1 | 10/2011 | Millward |
| 2011/0256723 | A1 | 10/2011 | Lee et al. |
| 2011/0316125 | A1 | 12/2011 | Thomas |
| 2012/0118854 | A1 | 5/2012 | Smayling et al. |
| 2012/0132988 | A1 | 5/2012 | Lui et al. |
| 2013/0196517 | A1 | 8/2013 | Tsujita et al. |
| 2013/0244344 | A1 | 9/2013 | Malmhall et al. |
| 2013/0329486 | A1 | 12/2013 | Juengling |
| 2014/0024219 | A1 | 1/2014 | Jung et al. |
| 2014/0038428 | A1 | 2/2014 | Huang et al. |
| 2014/0054534 | A1 | 2/2014 | Pellizzer et al. |
| 2014/0170853 | A1 | 6/2014 | Shamma et al. |
| 2014/0258961 | A1 | 9/2014 | Ke et al. |
| 2014/0273363 | A1 | 9/2014 | Chiu et al. |
| 2014/0273464 | A1 | 9/2014 | Shieh et al. |
| 2015/0056800 | A1 | 2/2015 | Mebarki et al. |
| 2015/0072527 | A1 | 3/2015 | Ng et al. |
| 2015/0087149 | A1 | 3/2015 | He et al. |
| 2015/0093899 | A1 | 4/2015 | Huang et al. |
| 2015/0108087 | A1 | 4/2015 | Somervell et al. |
| 2015/0140811 | A1 | 5/2015 | Huang et al. |
| 2015/0147882 | A1 | 5/2015 | Yao et al. |
| 2015/0179652 | A1 | 6/2015 | Wang et al. |
| 2015/0243654 | A1 | 8/2015 | Zhong et al. |
| 2015/0318173 | A1 | 11/2015 | Shih et al. |
| 2015/0318181 | A1 * | 11/2015 | Cantone .......... H01L 21/823431 438/702 |
| 2015/0339422 | A1 | 11/2015 | Greco et al. |
| 2016/0049307 | A1 | 2/2016 | Chen |
| 2016/0056075 | A1 | 2/2016 | Wei et al. |
| 2016/0056104 | A1 | 2/2016 | Bouche et al. |
| 2016/0064248 | A1 | 3/2016 | Lee et al. |
| 2016/0086841 | A1 | 3/2016 | Song et al. |
| 2016/0099178 | A1 | 4/2016 | Zhana et al. |
| 2016/0225634 | A1 | 8/2016 | Anderson et al. |
| 2016/0254191 | A1 | 9/2016 | Tseng et al. |
| 2016/0307844 | A1 * | 10/2016 | Oh .................... H01L 24/06 |
| 2017/0062439 | A1 * | 3/2017 | Mojumder ............ G11C 8/14 |
| 2017/0140986 | A1 | 5/2017 | Machkaoutsan et al. |
| 2017/0200717 | A1 * | 7/2017 | Huang ............... H01L 27/0886 |
| 2017/0221702 | A1 | 8/2017 | Lee et al. |

OTHER PUBLICATIONS

U.S. Appl. No. 15/271,475, filed Sep. 21, 2016.
U.S. Appl. No. 15/271,497, filed Sep. 21, 2016.
U.S. Appl. No. 15/141,087, filed Apr. 28, 2016.
U.S. Appl. No. 15/379,645, filed Dec. 15, 2016.
U.S. Appl. No. 15/379,707, filed Dec. 15, 2016.
U.S. Appl. No. 15/379,740, filed Dec. 15, 2016.
U.S. Appl. No. 15/362,035, filed Nov. 28, 2016.
U.S. Appl. No. 15/271,519, filed Sep. 21, 2016.
U.S. Appl. No. 15/053,818, filed Feb. 25, 2016.
U.S. Appl. No. 15/077,480, filed Mar. 22, 2016.
U.S. Appl. No. 15/077,564, filed Mar. 22, 2016.

* cited by examiner

APPARATUS AND METHOD FOR FORMING INTERCONNECTION LINES HAVING VARIABLE PITCH AND VARIABLE WIDTHS

TECHNICAL FIELD

The present invention relates to semiconductor devices and methods of fabricating the same. More specifically, the invention relates to a method and apparatus of forming back end of the line (BEOL) interconnection metal lines having variable pitch and variable line widths.

BACKGROUND

Technologies for fabricating semiconductor devices, such as transistors, capacitors and the like, for ultra-high density integrated circuits have been developed which extend patterning resolution beyond that of conventional lithography (which is typically limited to about 80 nm pitch). Self-aligned multiple patterning is one such class of high resolution patterning technologies. The current state of the art multiple patterning technology contemplated for commercial production is a method known as Self-Aligned Quadruple Patterning (SAQP), which is an extrapolation of the more commonly commercially used Self-Aligned Double Patterning (SADP) technique. Problematically, however, the theoretical minimum regular pitch (i.e., the minimum distance between repetitive features in a semiconductor device structure) for a SAQP process is about 20 nanometers (nm) using conventional lithographic techniques.

Moreover, formation of interconnect systems having large arrays of multiple parallel metal lines in a Back-End-Of-Line (BEOL) process flow for a semiconductor fabrication often require the metal lines to have both variable pitch and variable line widths. This kind of variability in both pitch and line width is very difficult to achieve with a conventional SAQP process. This is particularly the case when the pitch (i.e., the minimum distance between repetitive features in a semiconductor device structure) is less than or equal to 38 nm.

Typically, an interconnect system located in the back end, or BEOL portion, of a semiconductor structure will be composed of many cells of repetitive arrays of lines, wherein the overall height of each cell is an integer multiple of a minimum pitch, or track. The track (or minimum pitch) being equal to the minimum allowable line width plus the minimum space between the lines. For example, a five track cell in an interconnection system where the minimum pitch is 36 nm would have an overall height that is five times 36 nm, for a total of 180 nm. By way of another example, a six track cell having a minimum pitch of 28 nm would have an overall height of six times 28 nm, for a total of 168 nm.

However, within those cells, different lines will have different functions and, therefore, will require different line widths. For example, power lines within a typical cell are primarily used to deliver power to devices (such as transistors) in a semiconductor structure and signal lines within that same cell are used to carry signals to and from the semiconductor devices. Since the power lines must carry much more current than the signal lines, the power lines must be significantly wider than the signal lines and therefore require a larger pitch. This type of variability is difficult to achieve in an SAQP process. Moreover, other prior art processes that have more flexibility than the SAQP process, such as litho-etch litho-etch (LELE), are subject to lithographic variation problems that make them unreliable at small pitches, such as pitches below 36 nm.

Additionally, if the spaces between metal lines in a cell of a semiconductor interconnect system become too narrow due to, for example, such lithographic variability, those unacceptably small spaces can lead to time delayed shorting between the lines. Time delayed shorting, or Time Delayed Dielectric Breakdown (TDDB), can occur when the spaces between lines become so small that the dielectric isolating material between the lines becomes stressed over an extended period of time by the electric fields being generated between the lines.

Next generation lithographic techniques, such as extreme ultraviolet lithography (EUV), may potentially reduce such conventional lithographic variability. However, such technologies must overcome development problems that currently limit their resolution. For example, it is currently recognized that EUV cannot practically realize a 40 nm pitch or less, due to stochastic effects in resist exposure.

Accordingly, there is a need for an apparatus, and method of forming the same, of cells of an interconnect system for a semiconductor structure, wherein the spaces between lines within the cell are not subject to lithographic variability. Additionally, there is a need for the lines within the cells to be variable in width and variable in pitch. There is a need, specifically, for such variable line widths and pitches where the cells have a track (or minimum pitch between lines) of 36 nm or less.

BRIEF DESCRIPTION

The present invention offers advantages and alternatives over the prior art by providing an apparatus, and method of making the same, of a cell of metal lines for an interconnect system of a semiconductor structure. The metal lines are separated by spacers that are not subject to lithographic variation and, therefore, can be very accurately controlled even with a minimum line pitches of 36 nm or less. Additionally, the widths of the metal lines are variable.

A semiconductor cell in accordance with one or more aspects of the present invention includes a dielectric layer composed of a dielectric isolation material. An array of at least four substantially parallel metal lines is disposed within the dielectric layer. The metal lines have line widths that are substantially equal to or greater than a predetermined minimum line width. Line spacers are disposed between the metal lines and have the dielectric isolation material of the dielectric layer disposed therein. The line spacers have line spacer widths that are substantially equal to or greater than a predetermined minimum line spacer width, which is adequate to provide electrical isolation between the metal lines. The cell also includes an overall cell height that is substantially equal to an integer multiple of a plurality of cell tracks, each cell track being a minimum pitch of the cell. The minimum pitch being define by the minimum line width plus the minimum line spacer width. The minimum pitch also being equal to or less than 36 nm. Additionally, not all of the line widths are substantially equal and every other line spacer width is substantially equal.

A method in accordance with one or more aspects of the present invention includes providing a semiconductor structure having a first ($1^{st}$) organic planarization layer (OPL) disposed over a dielectric layer. An array of $1^{st}$ mandrels is patterned into the $1^{st}$ OPL. The $1^{st}$ mandrels have a $1^{st}$ mandrel width, a $1^{st}$ mandrel spacing between consecutive $1^{st}$ mandrels and a $1^{st}$ mandrel pitch. First mandrel spacers having a $1^{st}$ spacer width are formed on sidewalls of the $1^{st}$ mandrels. A second ($2^{nd}$) OPL is disposed over the structure. An array of $2^{nd}$ mandrels is patterned into the $2^{nd}$ OPL. The $2^{nd}$ mandrels have a $2^{nd}$ mandrel width and a $2^{nd}$ mandrel pitch equal to the $1^{st}$ mandrel pitch. A portion of the $2^{nd}$ mandrels overlaps the $1^{st}$ mandrels by a substantially constant mandrel overlap. Second mandrel spacers having a $2^{nd}$ spacer width are formed on sidewalls of the $2^{nd}$ mandrels. An array of at least four metal lines separated by line spacers in the dielectric layer is formed. The line spacers are alternately formed from the $1^{st}$ and $2^{nd}$ mandrel spacers. The metal lines have line widths formed from at least one of the mandrel overlap, $1^{st}$ mandrel width, $2^{nd}$ mandrel width and $1^{st}$ mandrel spacing.

DRAWINGS

The invention will be more fully understood from the following detailed description taken in conjunction with the accompanying drawings, in which.

DETAILED DESCRIPTION

Certain exemplary embodiments will now be described to provide an overall understanding of the principles of the structure, function, manufacture, and use of the methods, systems, and devices disclosed herein. One or more examples of these embodiments are illustrated in the accompanying drawings. Those skilled in the art will understand that the methods, systems, and devices specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present invention.

FIGS. 1-30B illustrate various exemplary embodiments of an apparatus, and method of making the same, of cells of an interconnect system for a semiconductor structure, wherein the spaces between lines within the cell are not subject to lithographic variation and the widths of the lines are variable in accordance with the present invention. Moreover, the invention can be applied to semiconductor cells of interconnection lines having a minimum pitch of 36 nm or less. Additionally, the invention may be applied to semiconductor cells of any number of tracks, for example, 5 track, 6 track and more.

Figure 1:
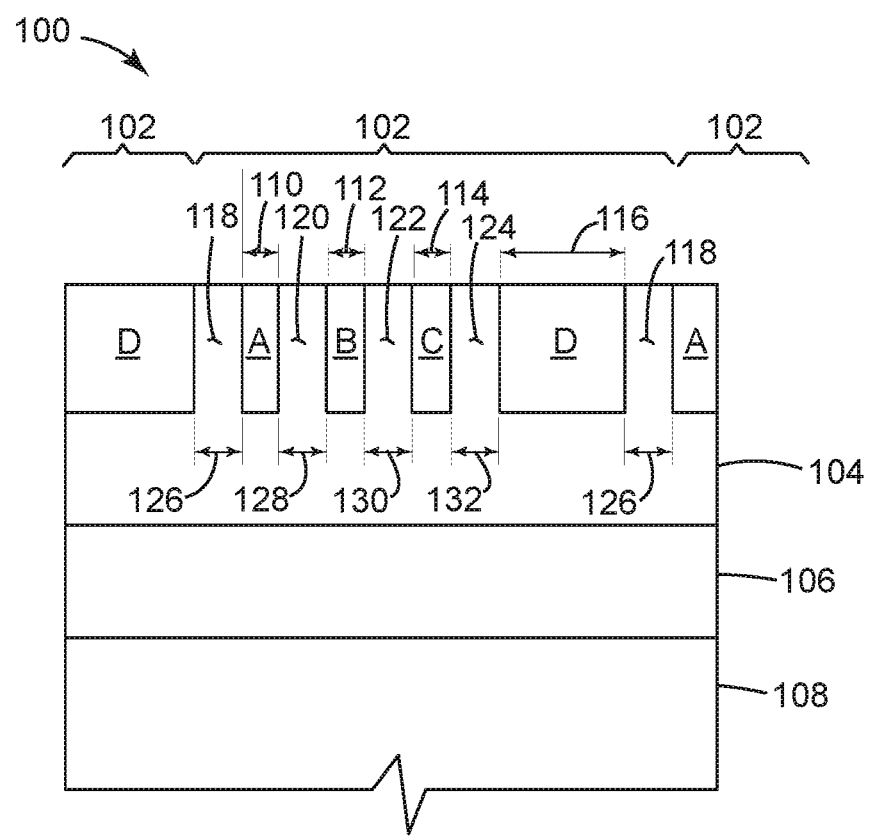
FIG. 1 is a cross-sectional view of an exemplary embodiment of a semiconductor structure of an integrated circuit having a metal interconnect cell of signal lines A, B and C and a power line D in accordance with the present invention.

Referring to FIG. 1, a simplified cross-sectional view of an exemplary embodiment of a semiconductor structure 100 of an integrated circuit in accordance with the present invention. Structure 100 includes a plurality of fully formed semiconductor cells 102 of metal interconnect lines A, B, C and D, which are disposed in a dielectric layer 104.

The dielectric layer 104 is composed of a dielectric isolation material such as a low K or ultra low K material or various combinations of silicon, carbon, oxygen and hydrogen (an SiCOH layer). The dielectric layer may be disposed over an etch-stop hard mask layer 106, such as a silicon nitride (SiN) or similar. The etch stop layer 106 may be disposed over a complex stack of buried layers 108 from the substrate (not shown) upwards.

The metal lines A, B, C and D of each cell 102 form an array of substantially parallel metal lines disposed within the dielectric layer 104. In this embodiment, the lines A, B and C represent signal lines for transmitting signals to and from devices in structure 100. Also, in this embodiment, the line D represents a power line for transmitting power to the devices in structure 100. As such, the power line D is required to carry significantly more current relative to signal lines A, B, C and, therefore, will be proportionally larger in width. Each of the metal lines A, B, C, D have line widths 110, 112, 114, 116 respectively that are substantially equal to or greater than a predetermined minimum line width 136 (best seen in FIG. 2) utilized in the manufacture of the structure 100.

A plurality of first ($1^{st}$) 118, second ($2^{nd}$) 120, third ($3^{rd}$) 122 and fourth ($4^{th}$) 124 line spacers are disposed between the metal lines A, B, C, D and have the dielectric isolation material of dielectric layer 104 disposed therein. The line spacers 118, 120, 122, 124 have first 126, second 128, third 130 and fourth 132 line spacer widths respectively that are substantially equal to or greater than a predetermine minimum line spacer width 140 (best seen in FIG. 2) that is adequate to provide proper electrical isolation between the metal lines A, B, C, D.

As will be explained in greater detail herein, not all of the line widths 110, 112, 114, 116 are substantially equal. In this particular embodiment, the line widths 110, 112, and 114 of lines A, B and C respectively are set substantially equal to the minimum line width 136. Additionally, in this particular embodiment, the line width 116 of line D is set substantially equal to twice the minimum line width 136 plus a minimum line spacer width 140.

Also, as will be explained in greater detail herein, every other line spacer width 126, 128, 130, 132 is substantially equal. That is, the first line spacer width 126 is substantially equal to the third line spacer width 130. Also the second line spacer width 128 is substantially equal to the fourth line spacer width 132. In this particular embodiment, the line spacer widths 126, 128, 130, 132 of line spacers 118, 120, 122, 124 respectively are set substantially equal to the minimum line spacer width 140.

Figure 2:
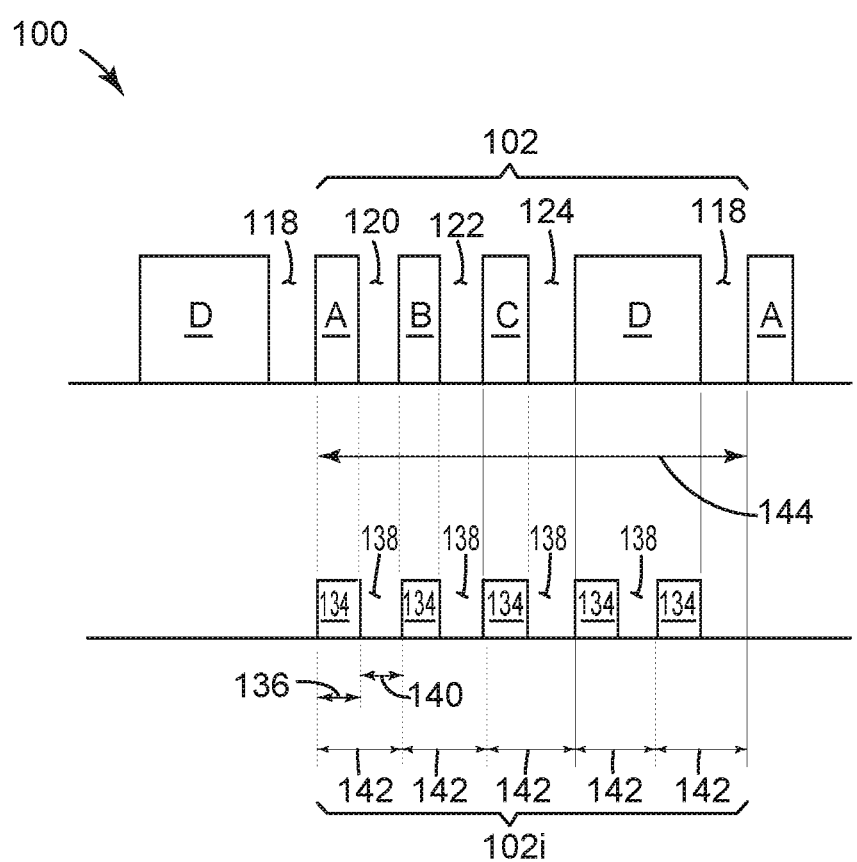
FIG. 2 is a cross-sectional view of the interconnect cell of FIG. 1 superimposed over an imaginary 5 track minimum pitch cell in accordance with the present invention.

Referring to FIG. 2, a simplified cross-sectional view of the cell 102, without the dielectric layer 104, is superimposed over an imaginary cell 102$i$. Imaginary cell 102$i$ is composed of a plurality of parallel metal lines 134 having the predetermined minimum line width 136, wherein the metal lines 134 are separated by line spacers 138 having the minimum line spacer width 140.

The combination of a minimum line width 136 and minimum line spacer width 140 defines a cell track 142. Each cell track 142 is also considered to be a minimum pitch 142 of the cell 102.

As will be explained in greater detail herein, the cell 102 has an overall cell height 144 that is substantially equal to an integer multiple of a plurality of cell tracks 142. In this particular embodiment, the overall cell height 144 of cell 102 is substantially equal to 5 cell tracks 142 combined and, therefore, is known as a five track cell. One skilled in the art would recognize that the overall cell height 144 may be equal to other integer multiples of cell track 142. For example, the cell height 144 could be equal to 6 cell tracks 142 in width, in which case the cell 102 would be referred to as a six track cell.

It is important to note that the minimum cell pitch 142 may be 36 nm or less. So, for example, the minimum cell pitch 142 of this cell 102 may be 36 nm, 32 nm, 28 nm, 26 nm or smaller, in accordance with the present invention.

Figure 3:
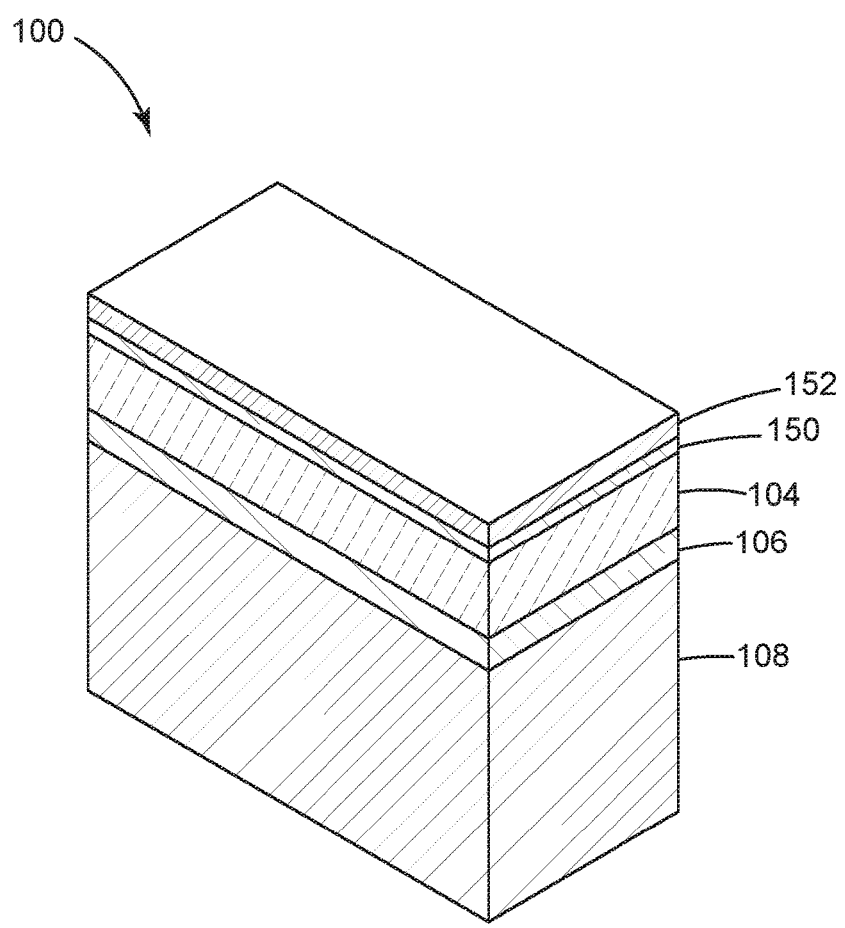
FIG. 3 is a perspective view of an exemplary embodiment of the semiconductor structure of FIG. 1 at an intermediate stage of manufacturing, wherein the structure is composed of a stack of layers including a first memorization layer, a first hardmask layer, a dielectric layer, an etch stop layer and buried layers in accordance with the present invention.

Referring to FIG. 3, a simplified perspective view of an exemplary embodiment of the semiconductor cell structure 100 is presented at an intermediate stage of manufacturing. During its manufacture, semiconductor cell structure 100 is formed from a built up stack of layers. The stack of layers includes a first hardmask layer 150 disposed over the dielectric layer 104, etch stop layer 106 and buried layers 108. The first hardmask layer may be composed of SiN or similar.

Disposed over the first ($1^{st}$) hardmask layer 150 is a first memorization layer 152. The first memorization layer 152 may be composed of an amorphous silicon (aSi) or similar. Both the first hardmask layer 150 and first memorization layer 152 may be applied over the dielectric layer 104 by any one of several well know deposition processes, such as atomic layer deposition (ALD), chemical vapor deposition (CVD) or similar.

Figure 4:
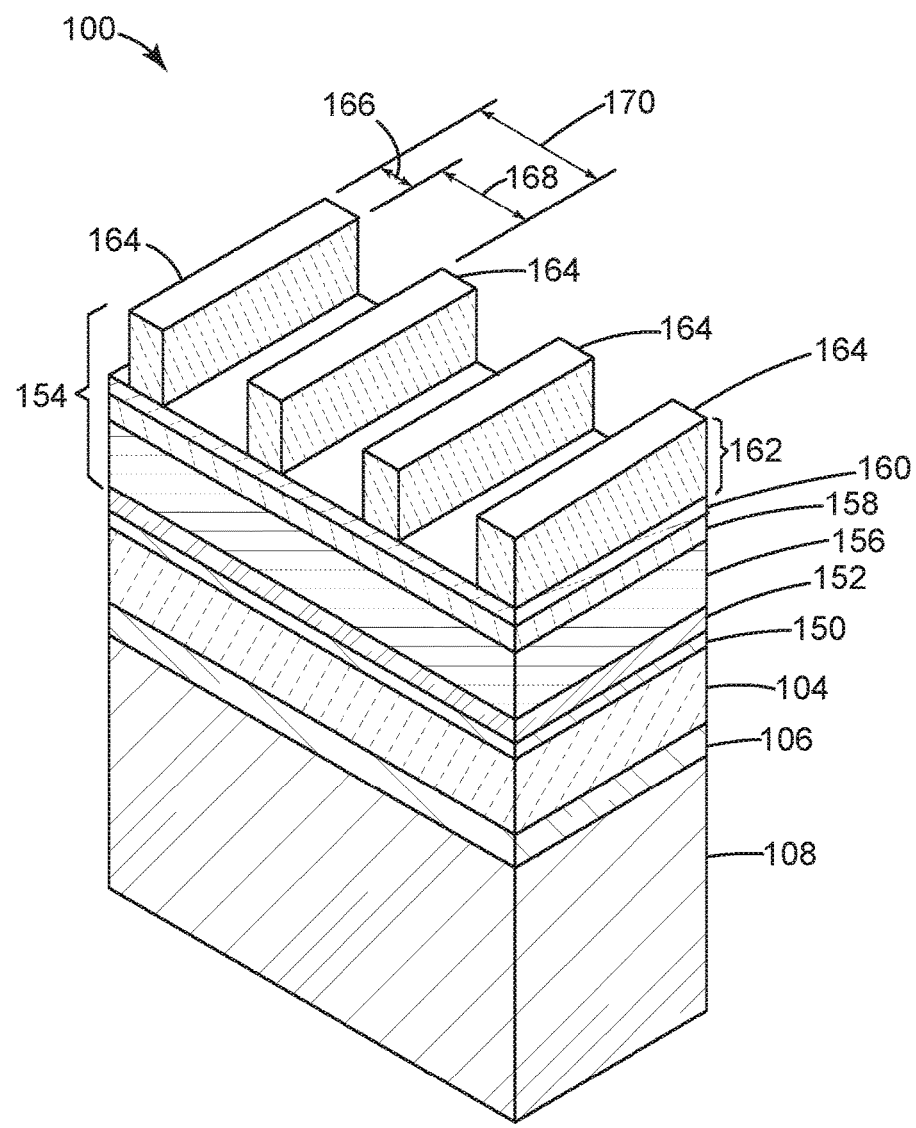
FIG. 4 is a perspective view of the structure of FIG. 3 with a first lithographic stack disposed thereon and first mandrels patterned into a resist layer of the lithographic stack in accordance with the present invention.

Referring to FIG. 4, once the first memorization layer 152 and $1^{st}$ hardmask layer 152 have been disposed over the dielectric layer 104 a first lithographic stack ($1^{st}$ litho stack) 154 is then disposed onto the first memorization layer 152. The litho stack 154 can be composed of several different kinds of layers, depending on such parameters as the application requirements, design or proprietary preferences or the like. One such stack of layers includes a stack of four thin films which includes (from bottom to top) a first organic planarization layer ($1^{st}$ OPL) 156, a first SiON cap layer 158, a first bottom antireflective coating (BARC) layer 160, and a first resist layer 162. The $1^{st}$ OPL 156 may be deposited through a spin-on process and may be composed of an organic material such as amorphous carbon or similar.

Once the stack 154 is disposed over the first memorization layer 152, an array of first (1$^{st}$) mandrels 164 is patterned into the resist layer 162 of the first lithographic stack 154 through well-known lithographic techniques. The 1$^{st}$ mandrels 164 are formed with a predetermined 1$^{st}$ mandrel width 166, a 1$^{st}$ mandrel spacing 168 between consecutive 1$^{st}$ mandrels 164 and a 1$^{st}$ mandrel pitch 170.

Figure 5:
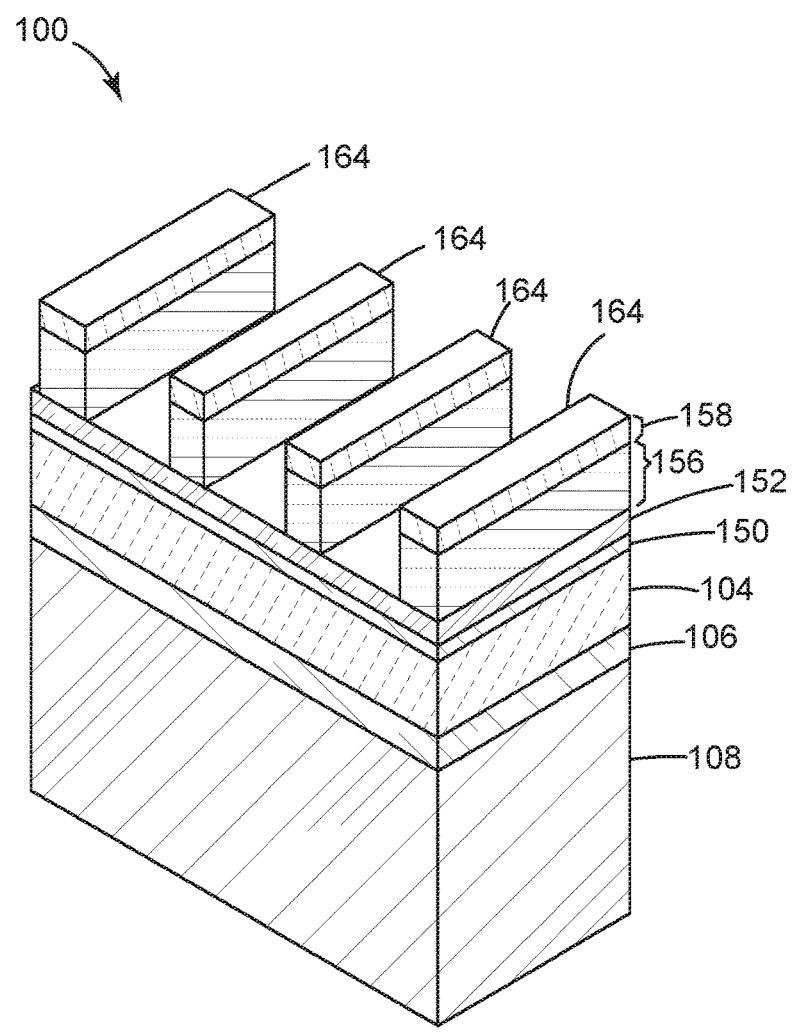
FIG. 5 is a perspective view the structure of FIG. 4 having the first mandrels patterned into a first organic planarization layer (OPL) of the first lithographic stack in accordance with the present invention.

Referring to FIG. 5, the first mandrels 164 are next patterned down to the 1$^{st}$ OPL 156 and the SiON cap layer 158. For purposes of clarity, any feature herein, such as a spacer, a trench, a mandrel or the like, that is etched down (i.e., formed or patterned) from an original feature will be referred to as such original feature if it has the same form and function as the original feature. However, it is well-known that the etched down feature will be a translation of the original feature and will be composed of remnants of the various layers involved in the etching process. More specifically, in the case of the mandrels 164, the original mandrels 164 were etched into the resist layer 162 and may be composed of resist layer 162 and BARC layer 160 (best seen in FIG. 4). However, once the mandrels 164 have been etched down and translated into 1$^{st}$ OPL 156, the mandrels 164 may be composed primarily of the material of the 1$^{st}$ OPL 156 and cap layer 158 (best seen in FIG. 5).

Figure 6:
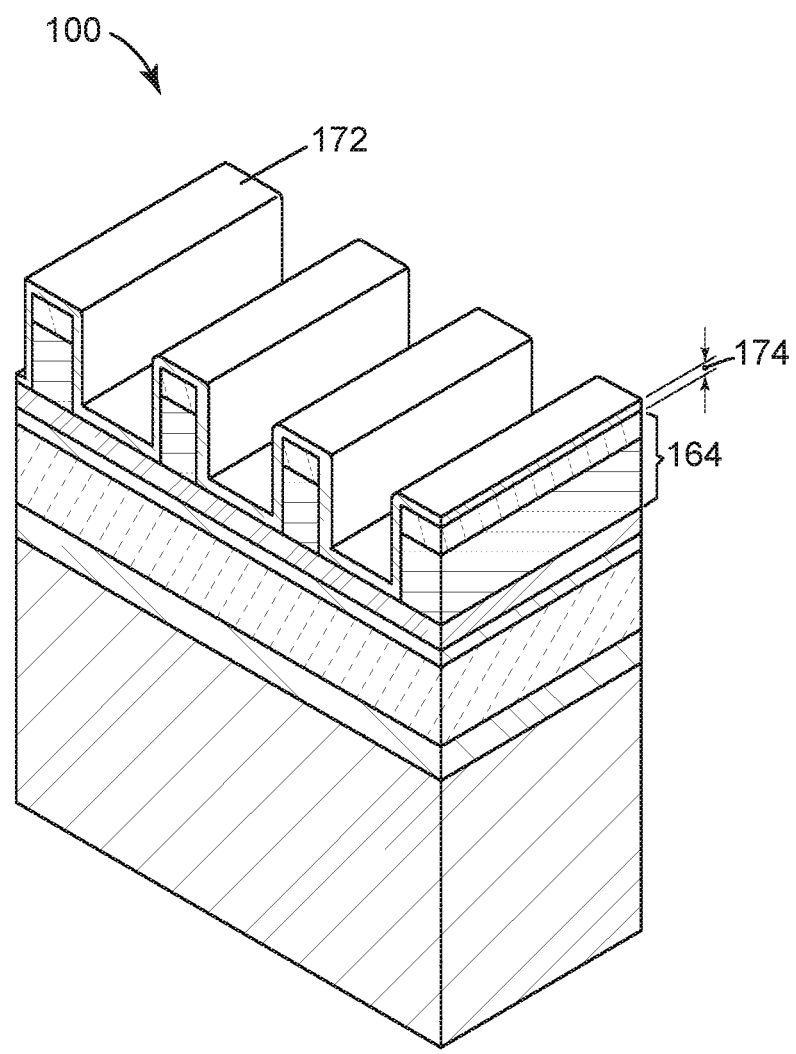
FIG. 6 is a perspective view of the structure of FIG. 5 having a first mandrel spacer layer disposed thereon in accordance with the present invention.

Referring to FIG. 6, a first mandrel spacer layer 172, having a predetermined first mandrel spacer layer thickness 174, is conformally coated over first mandrels 164. The first mandrel spacer layer 172 may be an oxide layer (such as SiO2) and may be coated over the first mandrels 164 by an atomic layer deposition (ALD) process.

Figure 7:
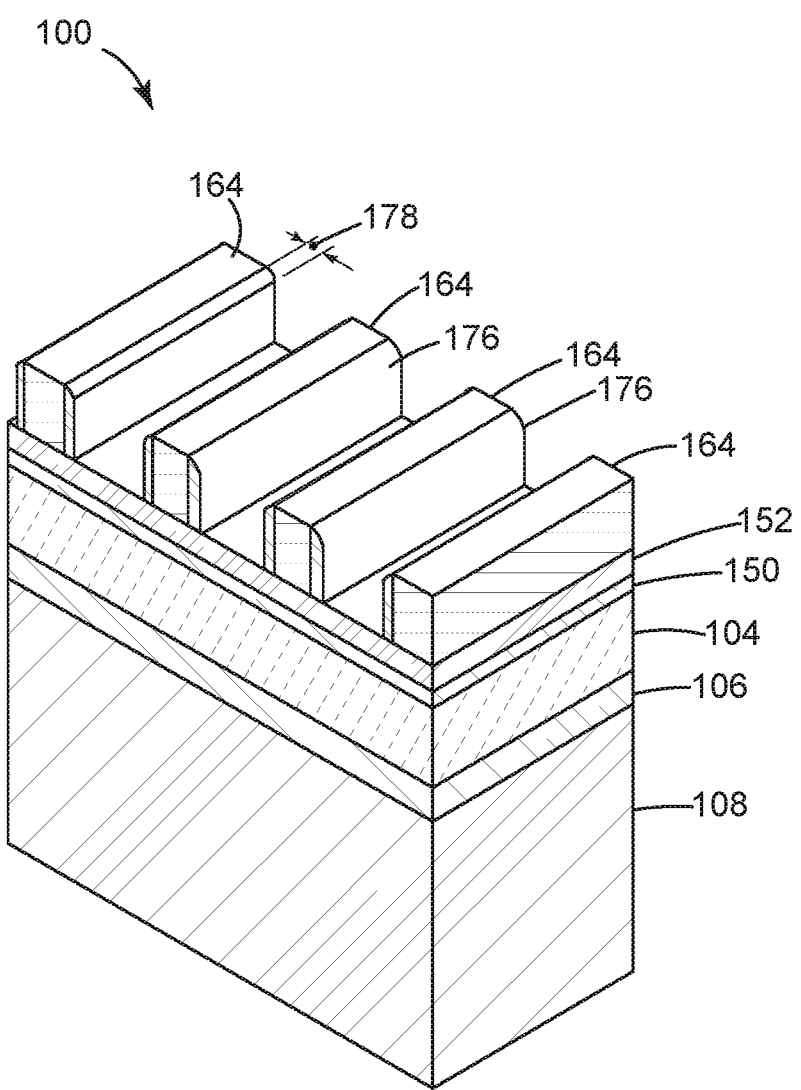
FIG. 7 is a perspective view of the structure of FIG. 6 having the first mandrel spacer layer anisotropically etched to form first mandrel spacers in accordance with the present invention.

Referring to FIG. 7, the SiO2 first mandrel spacer layer 172 and the SiON cap layer 158 are anisotropically etched to form first (1$^{st}$) mandrel spacers 176 on sidewalls of the first mandrels 164. The first mandrel spacers 176 have a first (1$^{st}$) spacer width 178 (best seen in FIG. 8) that is equal to the first mandrel spacer layer thickness 174.

Figure 8:
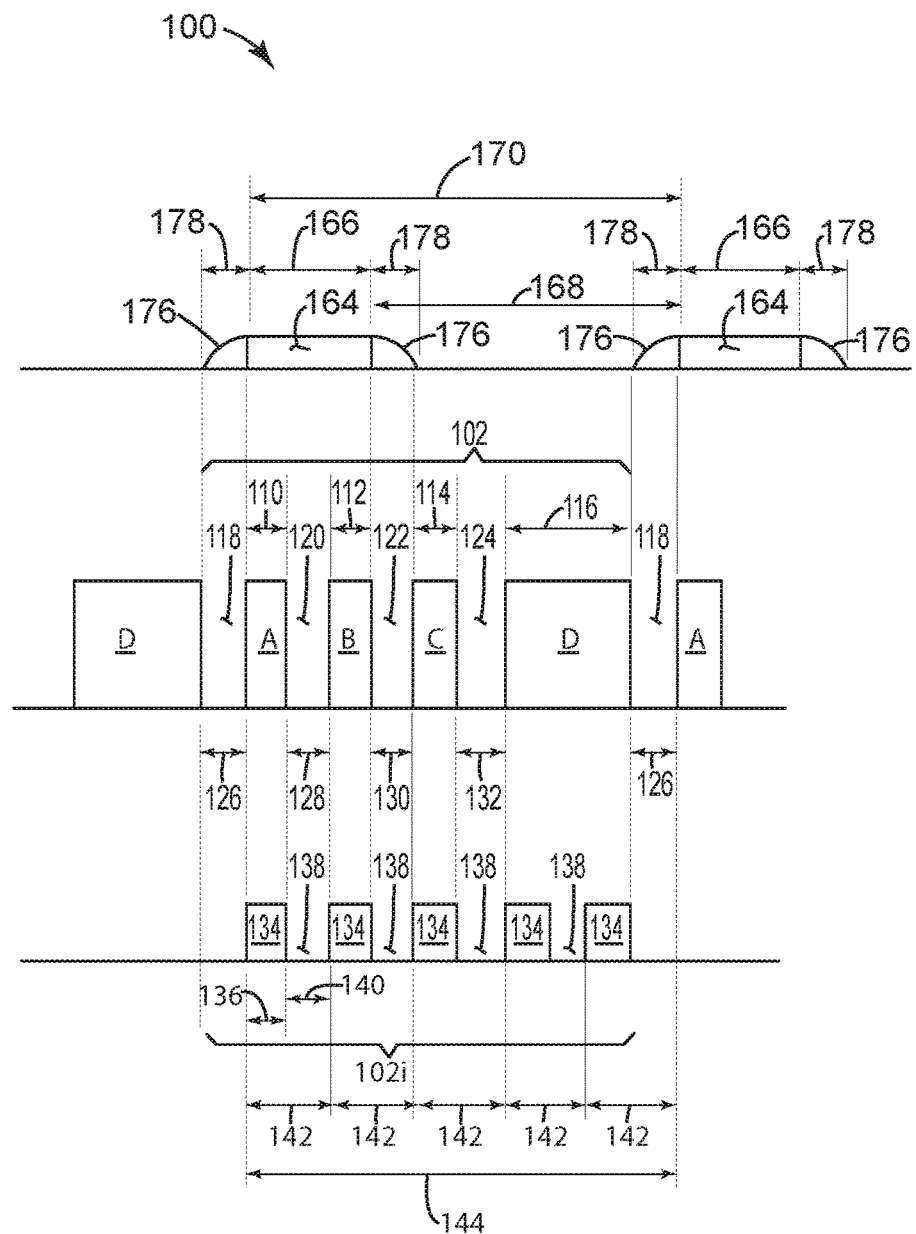
FIG. 8 is a cross-sectional view of the structure of FIG. 7 showing the relative positions of the first mandrels and first mandrel spacers superimposed over the relative positions of the metal interconnect cell and imaginary 5 track minimum pitch cell in accordance with the present invention.

Referring to FIG. 8, a simplified cross-sectional view of the relative positions of first mandrels 164 and first mandrel spacers 176 within structure 100 are superimposed over the relative positions of the cells 102 and 102i. As can be seen, the 1$^{st}$ mandrel spacers 176, which abut both sidewalls of the first mandrels 164, are located directly above the first 118 and third 122 line spacers of cell 102.

As will be explained in greater detail herein, the first mandrel spacers 176 will be patterned down to form the first and third line spacers 118, 122 subsequently in the process flow. Accordingly, the first mandrel spacer widths 178 are independent variables that exclusively control and define the first and third line spacer widths 126, 130 of cell 102. Because the first mandrel spacers 176 were formed through the process of ALD, the first mandrel spacer widths 178 can be closely controlled and are not subject to lithographic variation problems. As a result, the first and third line spacer widths 126 and 130, which are defined by first mandrel spacer widths 178, will be substantially equal. Typically, the line spacer widths 126, 130 can be held to be equal to within plus or minus 2 nm. In this particular embodiment, the line spacer widths 126, 130 are also set to be substantially equal to the minimum line spacer width 140 of cell 102i.

Because the first mandrel spacer widths 178 are variable and provide control of the line spacer widths 126, 130, the first mandrel spacer widths 178 are, therefore, considered in this embodiment to be independent variables that control features of cell 102. As will be explained in greater detail herein, the first mandrel width 166 and first mandrel spacing 168 between consecutive first mandrels 164 are also considered to be independent variables that control other specific features of cell 102. More specifically, the first mandrel width 166 provides control of the line width 110 of metal interconnect signal line A and the first mandrel spacing 168 provides control of the line width 116 of metal interconnect power line D. In this embodiment, since the first mandrel pitch 170 is as a function of the first mandrel width 166 plus the first mandrel spacing 168, then the first mandrel pitch 170 is not considered herein as an independent variable.

Figure 9:
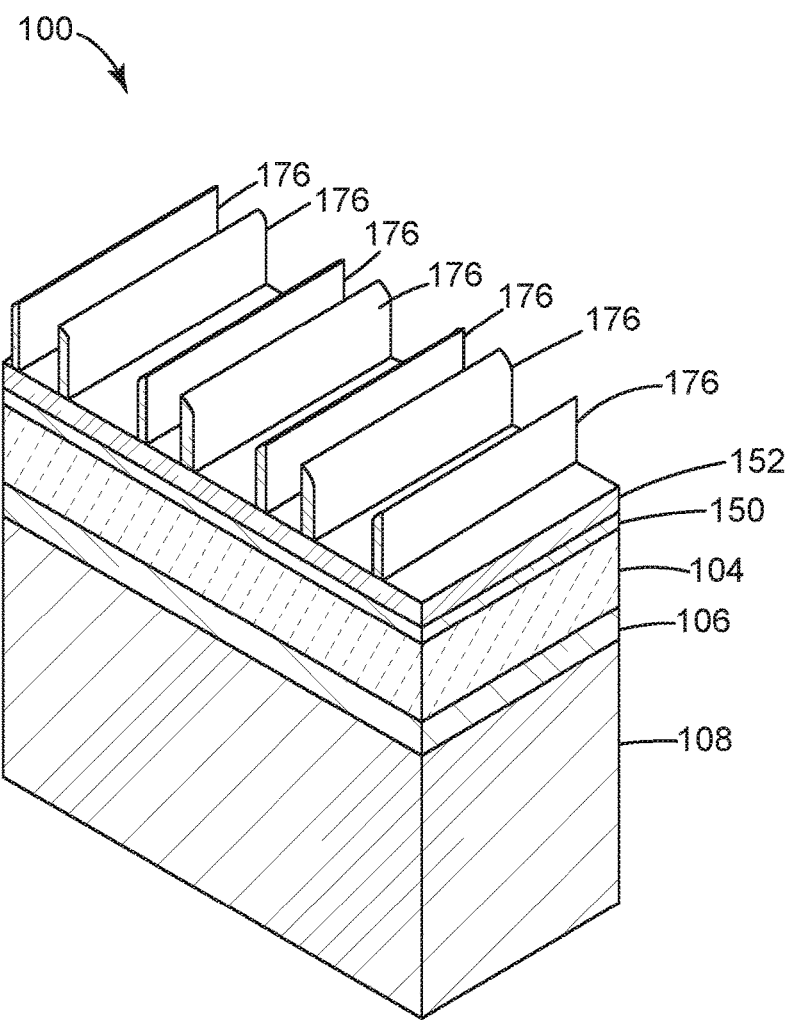
FIG. 9 is a perspective view of the structure of FIG. 7 having the first mandrels removed in accordance with the present invention.

Referring to FIG. 9, next in the process flow the first mandrels 164 are then removed or stripped, leaving just the first mandrel spacers 176 disposed on the first memorization layer 152. The removal of the first mandrels 164 can be done with anyone of several well-known processes, such as a wet etching process, a RIE process or similar.

Figure 10:
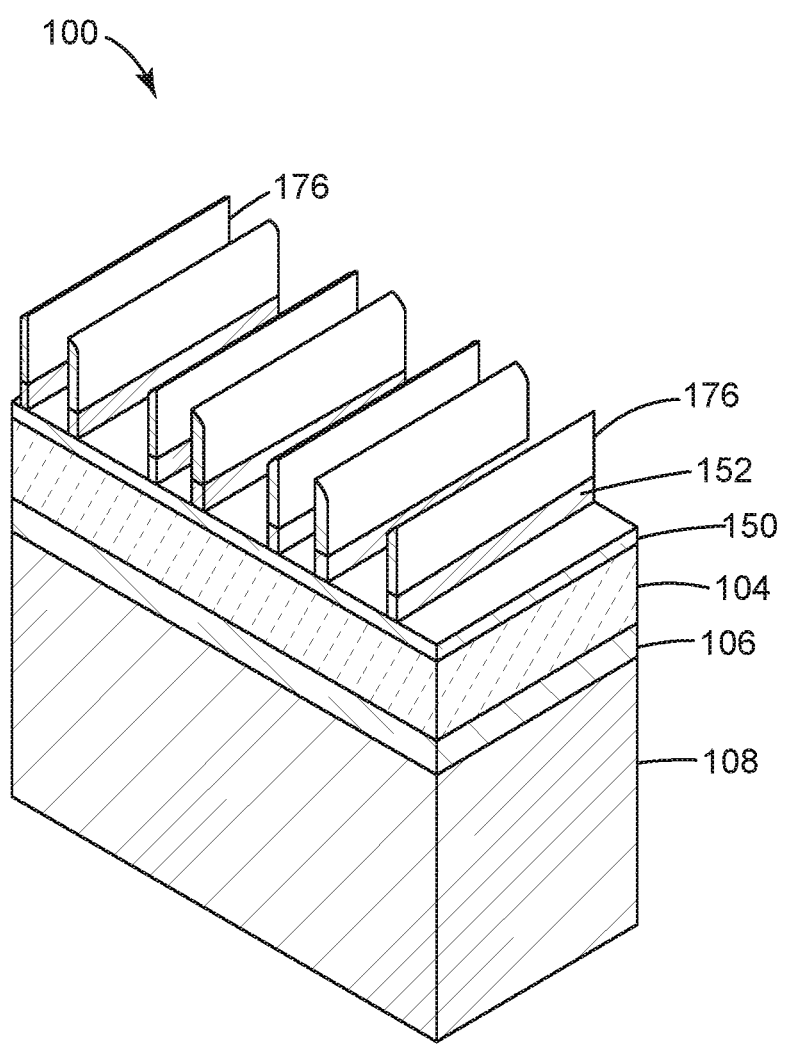
FIG. 10 is a perspective view of the structure of FIG. 9 having the first mandrel spacers etched into the first memorization layer.

Referring to FIG. 10, the first mandrel spacers 176 are patterned into the amorphous silicon (aSi) first memorization layer 152. This can be done by an anisotropic etch process such as RIE or similar.

Figure 11:
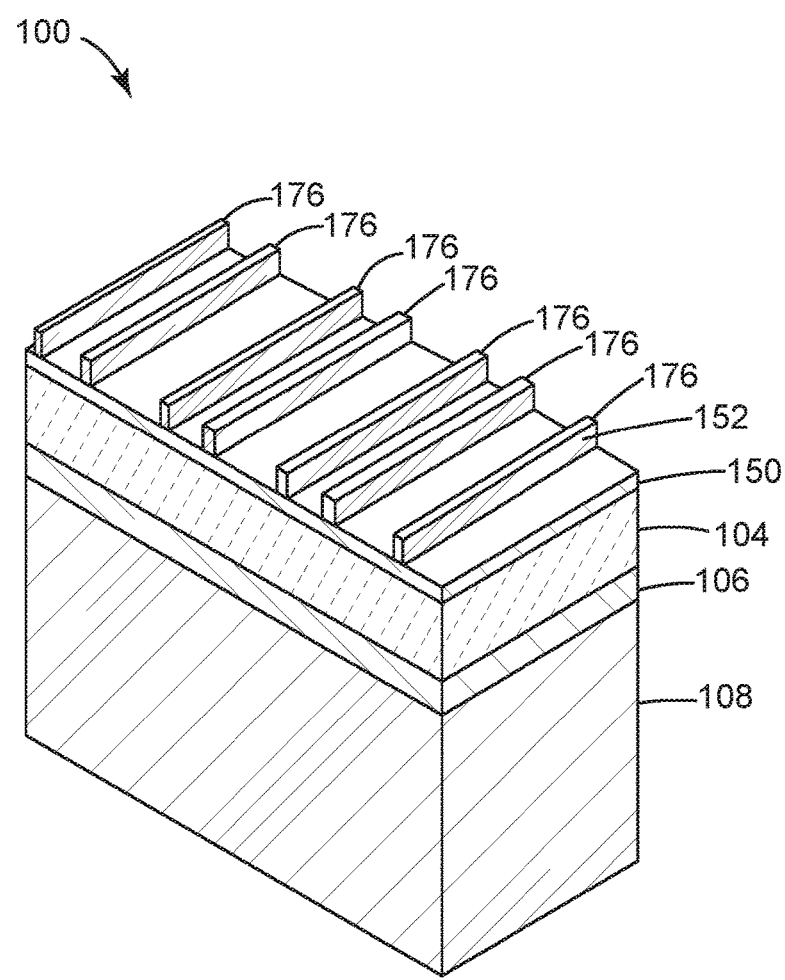
FIG. 11 is a perspective view of the structure of FIG. 10 having the remnants of the first spacer layer removed in accordance with the present invention.

Referring to FIG. 11, next the remnants of the SiO2 spacer layer 172 are removed, leaving just the first mandrel spacers 176 patterned into the aSi memorization layer 152. This can be done by such well know processes as wet etching or similar. Once the first mandrel spacers 176 have been preserved in the first memorization layer 152, the stack of layers that is structure 100 can be rebuilt for further processing.

Figure 12:
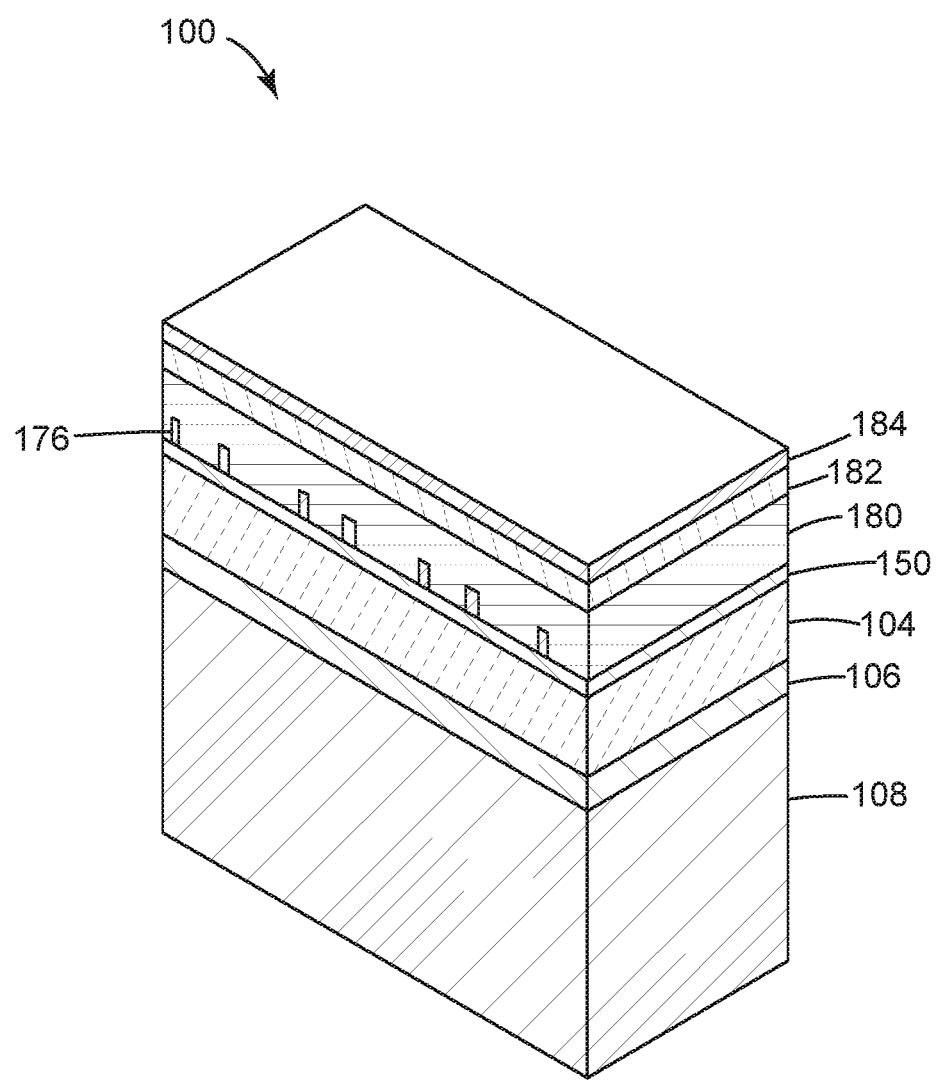
FIG. 12 is a perspective view of the structure of FIG. 11 having a spin-on hardmask (SOH) layer, second hardmask layer and second memorization layer disposed thereon in accordance with the present invention.

Referring to FIG. 12, the structure 100 stack is rebuilt, in this embodiment, with a spin-on hardmask (SOH) layer 180 disposed over the structure 100. The SOH layer is deposited with a spin-on process and may be composed of organic or inorganic materials suitable for the spin-on process, such as amorphous carbon, SiON or similar.

Disposed over the SOH layer 180 is a second hardmask layer 182 of, for example, SiN or similar. Disposed over the second hardmask layer 182 is a second aSi memorization layer 184. The second hardmask layer 182 and second memorization layer 184 may be applied over the SOH layer 180 by any one of several well know deposition processes, such as atomic layer deposition (ALD), chemical vapor deposition (CVD) or similar.

Figure 13:
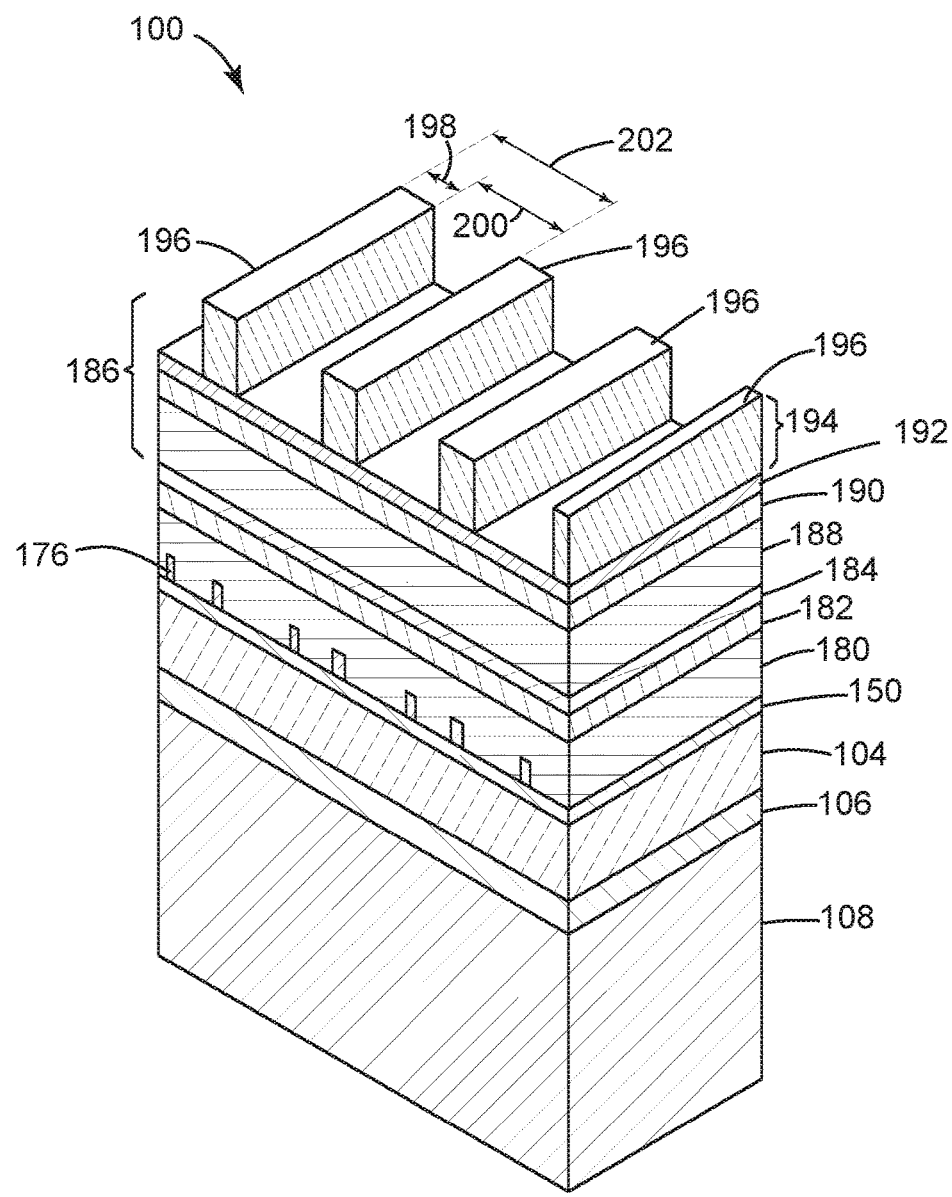
FIG. 13 is a perspective view of the structure of FIG. 12 with a second lithographic stack disposed thereon and second mandrels patterned into a resist layer of the second lithographic stack in accordance with the present invention.

Referring to FIG. 13, once the second memorization layer 184 and 2$^{nd}$ hardmask layer 182 have been disposed over the SOH layer 180 a second lithographic stack (2$^{nd}$ litho stack) 186 is then disposed onto the 2$^{nd}$ memorization layer 184. The 2$^{nd}$ litho stack 186 includes (from bottom to top) a second organic planarization layer (2$^{nd}$ OPL) 188, a second SiON cap layer 190, a second bottom antireflective coating (BARC) layer 192, and a second resist layer 194. The 2$^{nd}$ OPL 188 may also be composed of an organic material such as amorphous carbon or similar. The 2$^{nd}$ OPL 188 may be applied by a spin-on process.

Once the second litho stack 186 is disposed over the second memorization layer 184, an array of second mandrels 196 is patterned into the second resist layer 194 of the second lithographic stack 186 through well-known lithographic techniques. The 2$^{nd}$ mandrels 196 are formed with a predetermined 2$^{nd}$ mandrel width 198, a 2$^{nd}$ mandrel spacing 200 between consecutive 2$^{nd}$ mandrels 196 and a 2$^{nd}$ mandrel pitch 202.

It is important to note that the 2$^{nd}$ mandrel pitch 202 of second mandrels 196 is set substantially equal to the first mandrel pitch 170 of the first mandrels 164. This is because (as can best be seen in FIG. 17) the second mandrels 196 are positioned relative to the first mandrels 164 such that a portion of the 2$^{nd}$ mandrels overlap the 1$^{st}$ mandrels 164 by a substantially constant mandrel overlap 212 (best seen in FIG. 17). If the first mandrel pitch 170 and the second mandrel pitch 202 were not equal, then the mandrel overlap 212 would not be equal from cell 102 to cell 102 within a potentially large number of cells 102 of the structure 100.

Figure 14:
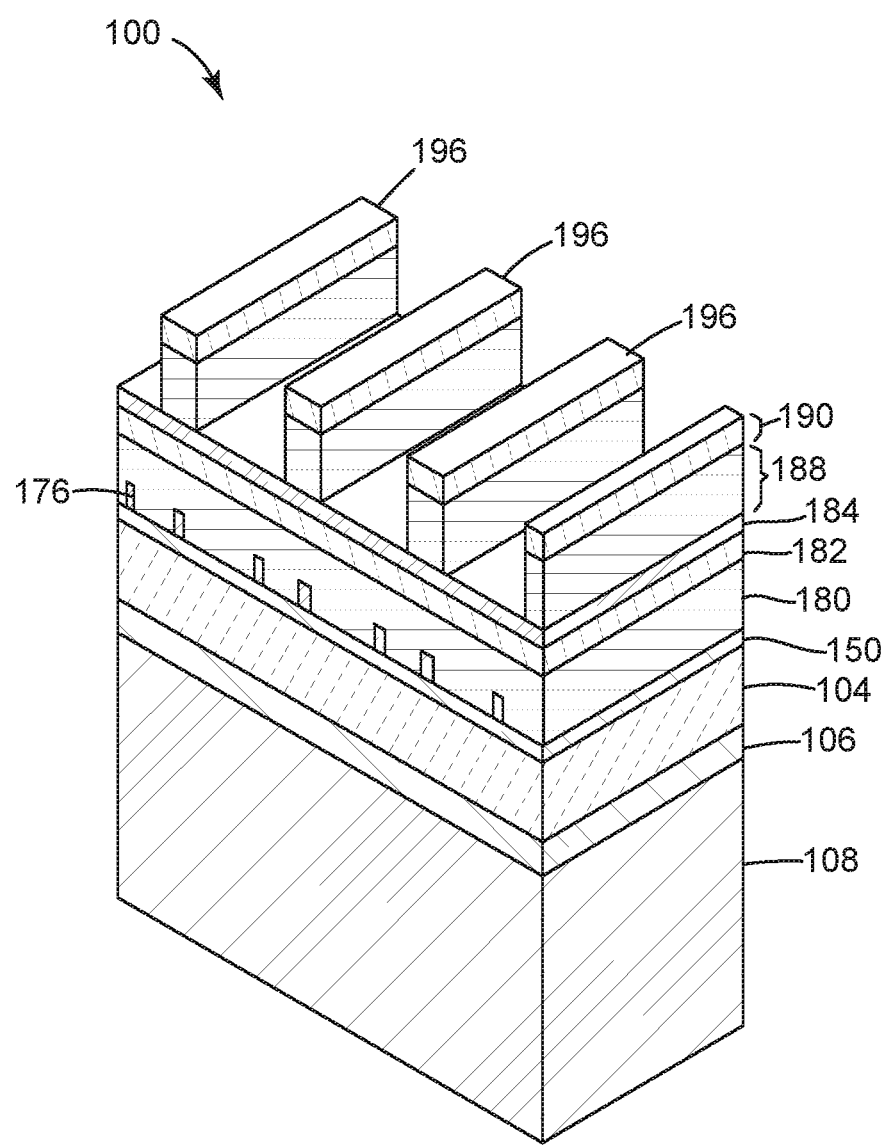
FIG. 14 is a perspective view the structure of FIG. 13 having the second mandrels patterned into a second OPL of the second lithographic stack in accordance with the present invention.

Referring to FIG. 14, the second mandrels 196 are next patterned down to the $2^{nd}$ OPL 188 and the second SiON cap layer 190. This can be accomplished by an anisotropic etch process such as RIE or similar.

Figure 15:
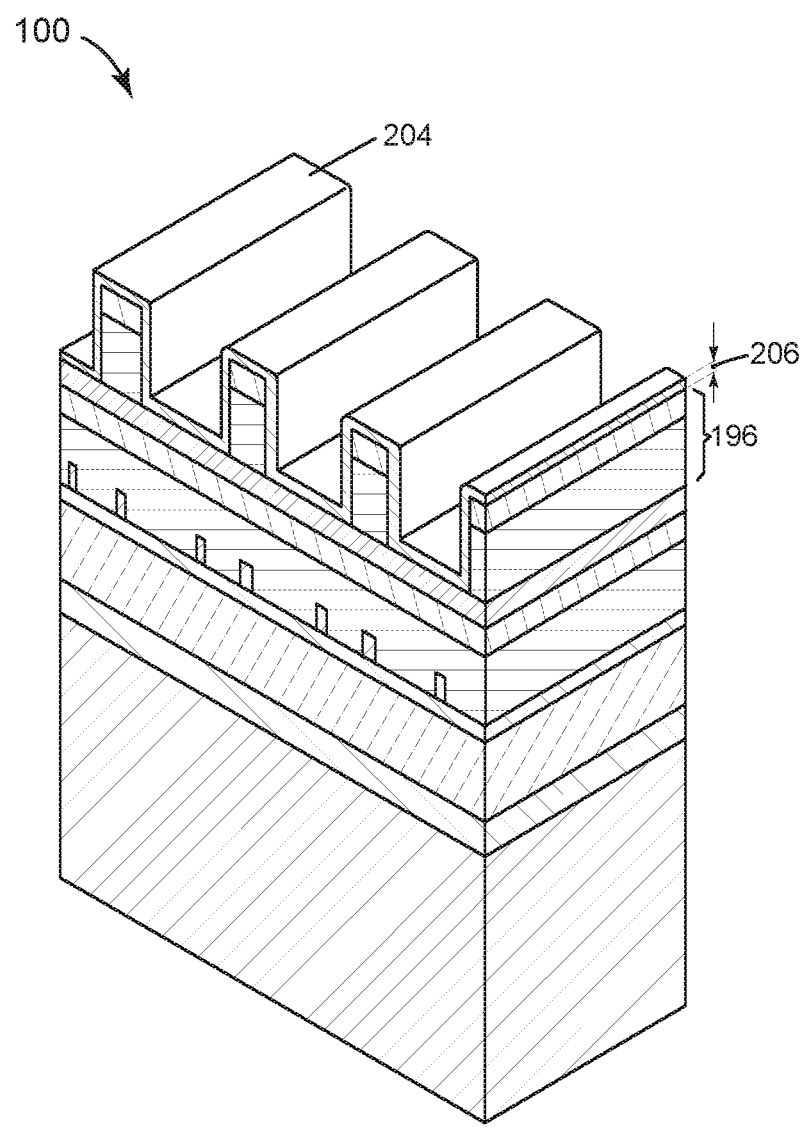
FIG. 15 is a perspective view of the structure of FIG. 14 having a second mandrel spacer layer disposed thereon in accordance with the present invention.

Referring to FIG. 15, a second mandrel spacer layer 204, having a predetermined second mandrel spacer layer thickness 206, is conformally coated over the second mandrels 196. The second mandrel spacer layer 204 may be an oxide layer (such as SiO2) and may be coated over the second mandrels 196 by an atomic layer deposition (ALD) process.

Figure 16:
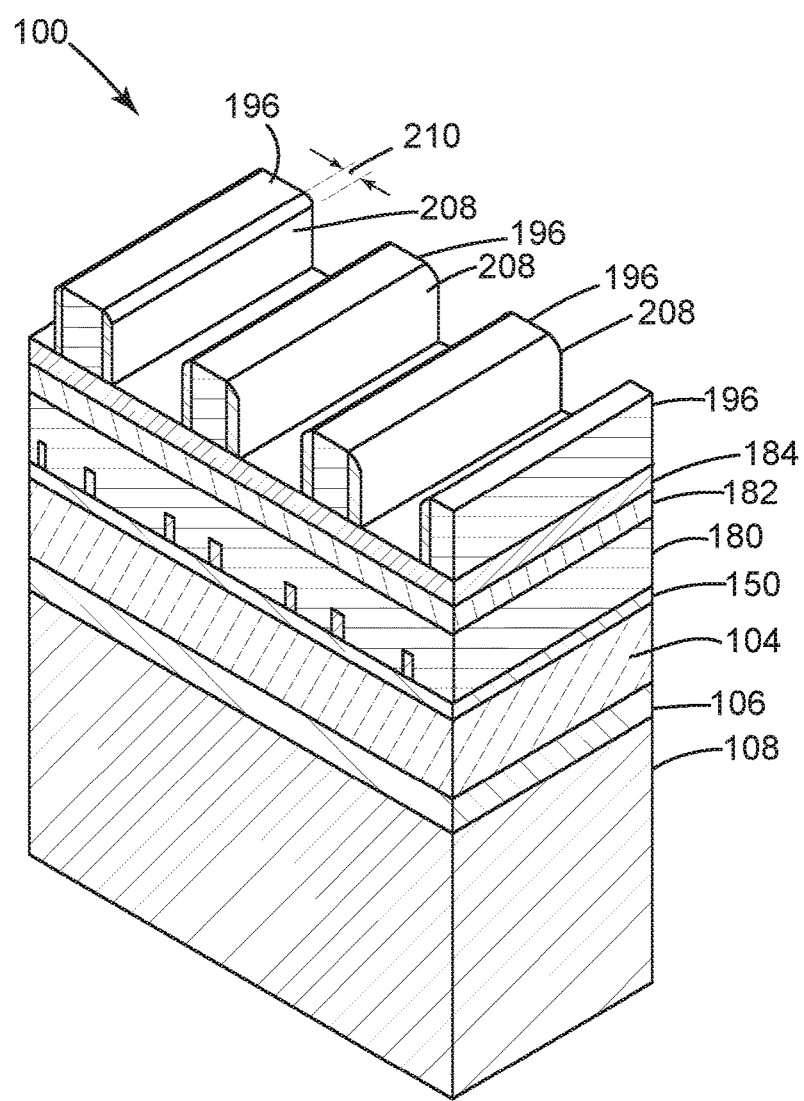
FIG. 16 is a perspective view of the structure of FIG. 15 having the second mandrel spacer layer anisotropically etched to form second mandrel spacers in accordance with the present invention.

Referring to FIG. 16, the SiO2 second mandrel spacer layer 204 and the SiON second cap layer 190 are anisotropically etched to form second ($2^{nd}$) mandrel spacers 208 on sidewalls of the second mandrels 196. The second mandrel spacers 208 have a second ($2^{nd}$) spacer width 210 (best seen in FIG. 17) that is equal to the second mandrel spacer layer thickness 206.

Figure 17:
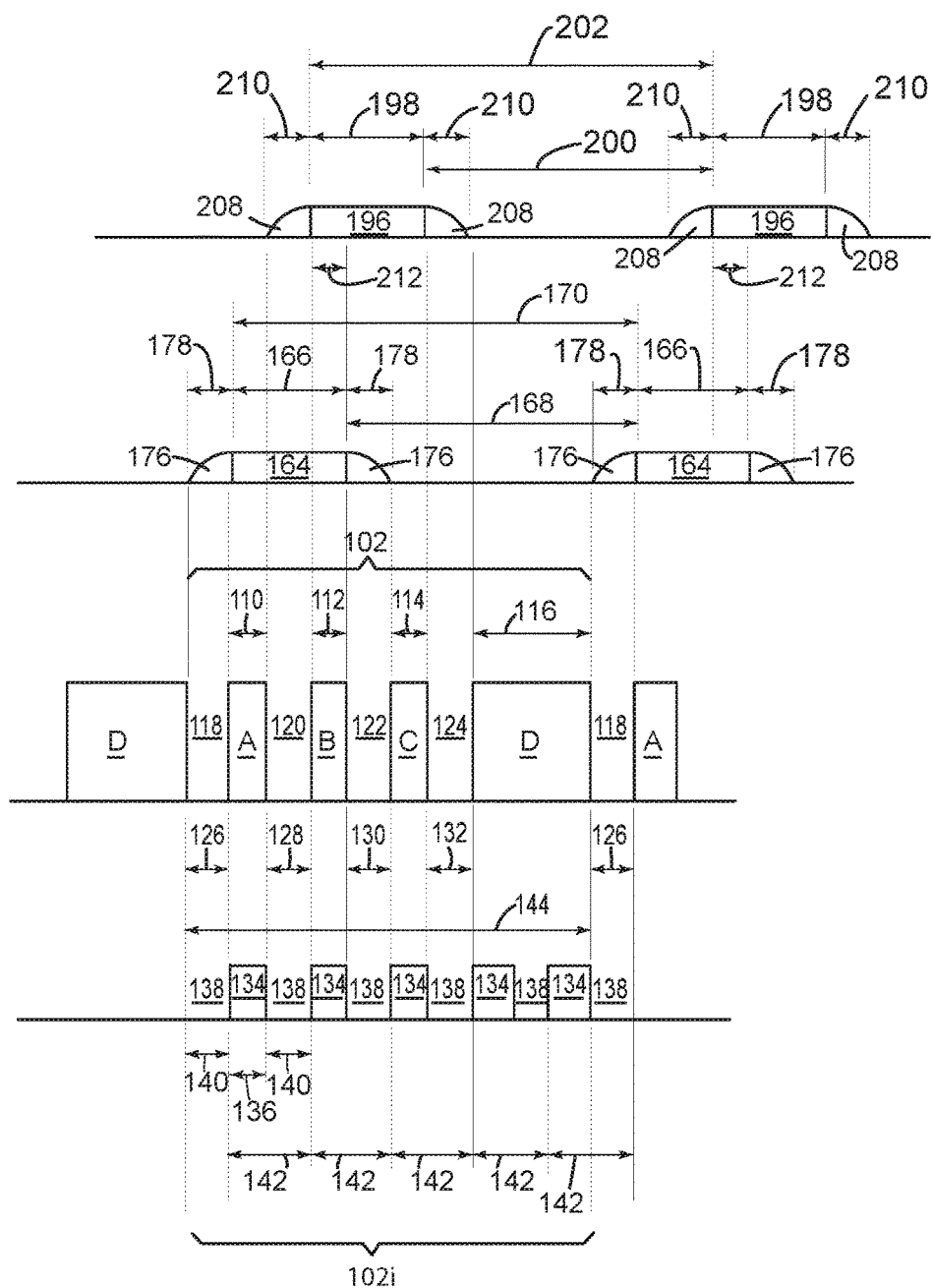
FIG. 17 is a cross-sectional view of the structure of FIG. 16 showing the relative positions of the second mandrels and second mandrel spacers superimposed over the first mandrels and first mandrel spacers and also superimposed over the relative positions of the metal interconnect cell and imaginary 5 track minimum pitch cell in accordance with the present invention.

Referring to FIG. 17, in similar fashion to FIG. 8, a simplified cross-sectional view of the relative positions of the second mandrels 196 and their associated second mandrel spacers 208 within structure 100 are superimposed over the relative positions of the first mandrels 164 and associated spacers 176 as well as the relative positions of the cells 102 and 102$i$. As can be seen, the $2^{nd}$ mandrel spacers 208, which abut both sidewalls of the second mandrels 196, are located directly above the second 120 and fourth 124 line spacers of cell 102.

As will be explained in greater detail herein, the second mandrel spacers 208 will be patterned down to form the second and fourth line spacers 120, 124 subsequently in the process flow. Accordingly, the second mandrel spacer widths 210 are independent variables that exclusively control and define the second and fourth line spacer widths 128, 132 of cell 102. Because the second mandrel spacers 196 were formed through the process of ALD, the second mandrel spacer widths 210 can be closely controlled and are not subject to lithographic variation problems. As a result, the second and fourth line spacer widths 128 and 132, which are defined by first mandrel spacer widths 210, will be substantially equal. Typically, the line spacer widths 128, 132 can be held to be equal to within plus or minus 2 nm. In this particular embodiment, the line spacer widths 128, 132 are also set to be substantially equal to the first and third line spacer widths 126, 130 of cell 102 as well as the minimum line spacer width 140 of cell 102$i$.

As first discussed with reference to FIG. 13, but best seen in this FIG. 17, the $2^{nd}$ mandrel pitch 202 of second mandrels 196 is set substantially equal to the first mandrel pitch 170 of the first mandrels 164. This is because the second mandrels 196 are positioned relative to the first mandrels 164 such that a portion of the $2^{nd}$ mandrels overlap the $1^{st}$ mandrels 164 by a mandrel overlap 212 that remains substantially constant from cell 102 to cell 102 throughout the structure 100. If the first mandrel pitch 170 and the second mandrel pitch 202 were not equal, then the mandrel overlap 212 would not be equal from cell 102 to cell 102 within a potentially large number of cells 102 of the structure 100.

In addition to the second mandrel spacer width 210, the overlap 212 and the second mandrel width 198 are also considered to be independent variables in this embodiment. In fact, with the formation of the first and second mandrels 164, 196 and their respective associated first and second mandrel spacers 176, 208, there are now a total of six independent variables that can be used to control the features of cell 102. Those independent variables can be grouped into two categories, i.e., independent variables that are not subject to lithographic variations and independent variables that are subject to lithographic variations.

The independent variables that are not subject to lithographic variations are the first and second spacer widths 178, 210. These variables are controlled by the ALD process and can control features in the cell 102 to tolerances as low as plus or minus 2 nm. For example, the minimum line spacer width 140, which may be set by either the first or second spacer widths 178, 210, can typically be set at 12 nm plus or minus 2 nm.

The independent variables that are subject to lithographic variations are the first mandrel width 166, the first mandrel spacing 168, the second mandrel width 198 and the mandrel overlap 212. These variables are more flexible than the spacer widths 178, 210, but have greater variations that must be taken into consideration. For example, the minimum line width 136 of cell 102, which may be set by the mandrel overlap 212, can typically be set at 12 nm plus or minus 4 nm.

It is important to note that the independent variables that are not subject to lithographic variations, i.e., the first and second spacer widths 178, 210, have exclusive control over all the line spacer widths 126, 128, 130 and 132 of the first 118, second 120, third 122 and fourth 124 line spacers of cell 102. Advantageously, this means that the spaces 118, 120, 122, 124 between the lines A, B, C, D within the cell 102 are not subject to lithographic variations and, therefore, inadvertent shorting between such lines can be avoided even for such small minimum line pitches of 36 nm, 32 nm, 28 nm, 26 nm and lower.

It is also important to note that the independent variables that are subject to lithographic variations, i.e., the $1^{st}$ mandrel width 166, the $1^{st}$ mandrel spacing, the $2^{nd}$ mandrel width and the mandrel overlap 212, have control of all the line widths 110, 112, 114 and 116 of respective metal lines A, B, C and D within cell 102. More specifically, it can be derived from FIG. 17 that:

(Line width 110 of line A)=($1^{st}$ mandrel width 166)–(mandrel overlap 212)–($2^{nd}$ mandrel spacer width 210);

(Line width 112 of line B)=(the mandrel overlap 212);

(Line width 114 of line C)=($2^{nd}$ mandrel width 198)–(mandrel overlap 212)–($1^{st}$ mandrel spacer width 178); and (Line width 116 of line D)=($1^{st}$ mandrel spacing 168)+(the mandrel overlap 212)–($2^{nd}$ mandrel width 198)–($1^{st}$ mandrel spacer width 178)–($2^{nd}$ mandrel spacer width 210).

Based on the above equations, it can be seen that:

Line width 110 of line A is a function of at least the $1^{st}$ mandrel width 166;

Line width 112 of line B is a function of at least the mandrel overlap 212;

Line width 114 of line C is a function of at least the $2^{nd}$ mandrel width 198; and Line width 116 of line D is a function of at least the $1^{st}$ mandrel spacing 168.

Also based on the above equations, it can be seen that maximum flexibility is provided for each line width 110, 112, 114, 116 of each metal line A, B, C, D so long as worst case lithographic variations are taken into account. Additionally, whatever the line widths are set to, the minimum line spacer width 140 between metal lines is always preserved and is independent of lithographic variations.

In this particular embodiment, the $1^{st}$, $2^{nd}$, $3^{rd}$, and $4^{th}$ line spacers 118, 120, 122 and 124 are set to have substantially equal widths and set to be substantially equal to the minimum line spacer width 140. Additionally in this embodiment, because the consecutive metal lines A, B and C are signal lines, they have line widths 110, 112, 114 that are set to be substantially equal. Further in this embodiment, because metal line D is a power line, it has a line width 116 that is set to be greater than twice the line width 110 of line A.

Figure 18:
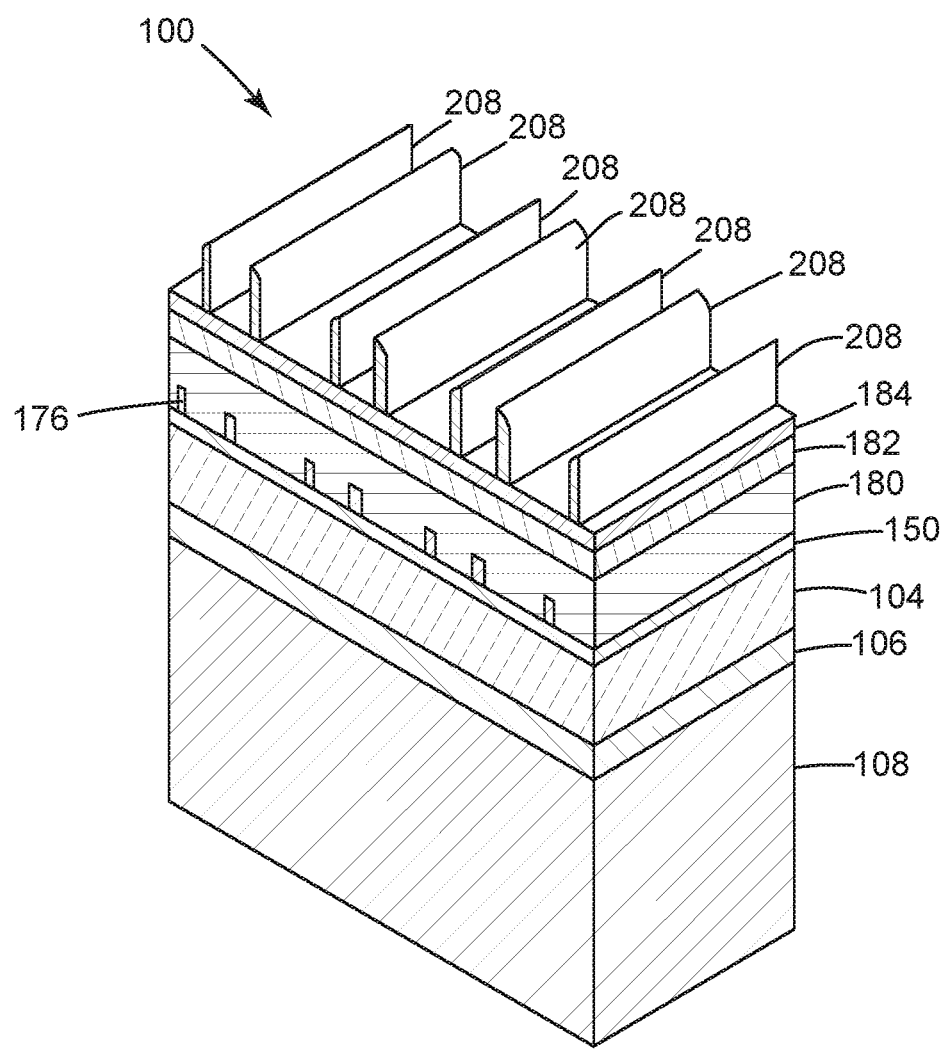
FIG. 18 is a perspective view of the structure of FIG. 16 having the second mandrels removed in accordance with the present invention.

Referring to FIG. 18, next in the process flow the second mandrels 196 are then removed or stripped, leaving just the second mandrel spacers 208 disposed on the second memorization layer 184. The removal of the second mandrels 196 can be done with anyone of several well-known processes, such as a wet etching process, a RIE process or similar.

Figure 19:
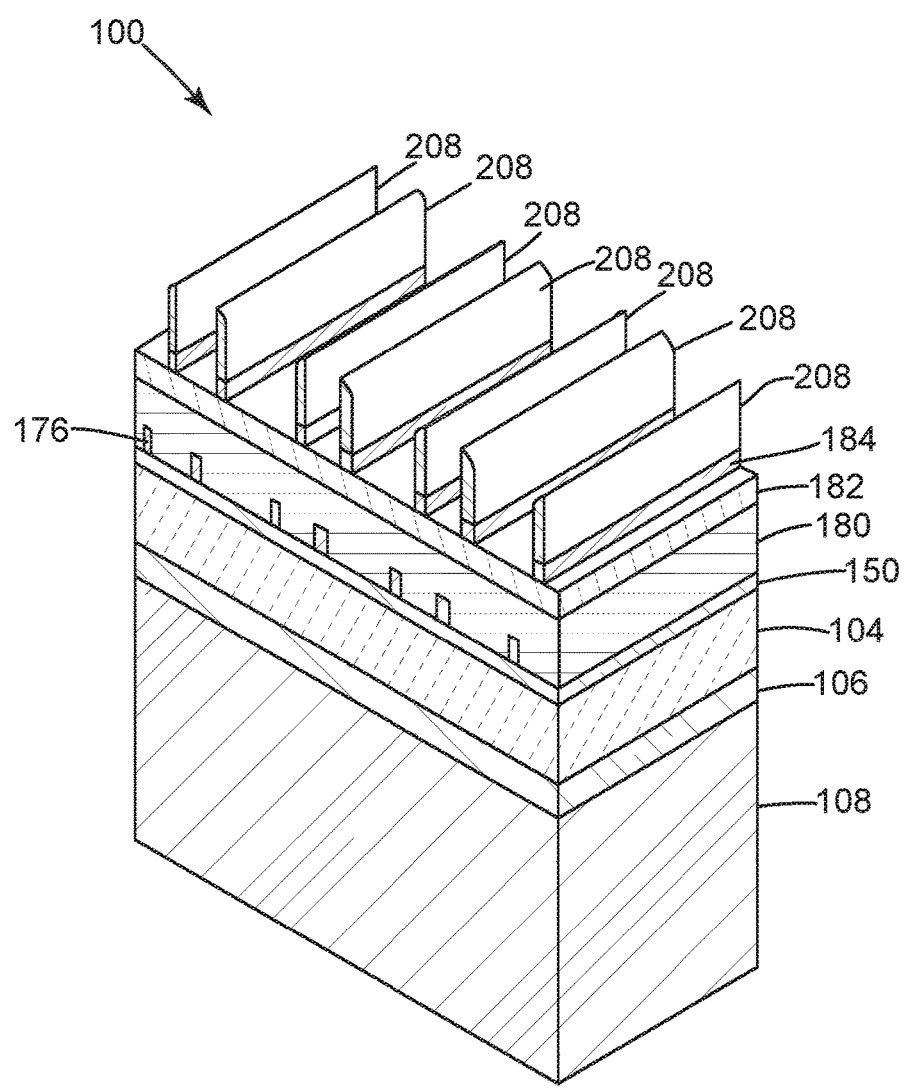
FIG. 19 is a perspective view of the structure of FIG. 18 having the second mandrel spacers etched into the second memorization layer.

Referring to FIG. 19, the second mandrel spacers 208 are patterned into the amorphous silicon (aSi) second memorization layer 184. This can be done by an anisotropic etch process such as RIE or similar.

Figure 20:
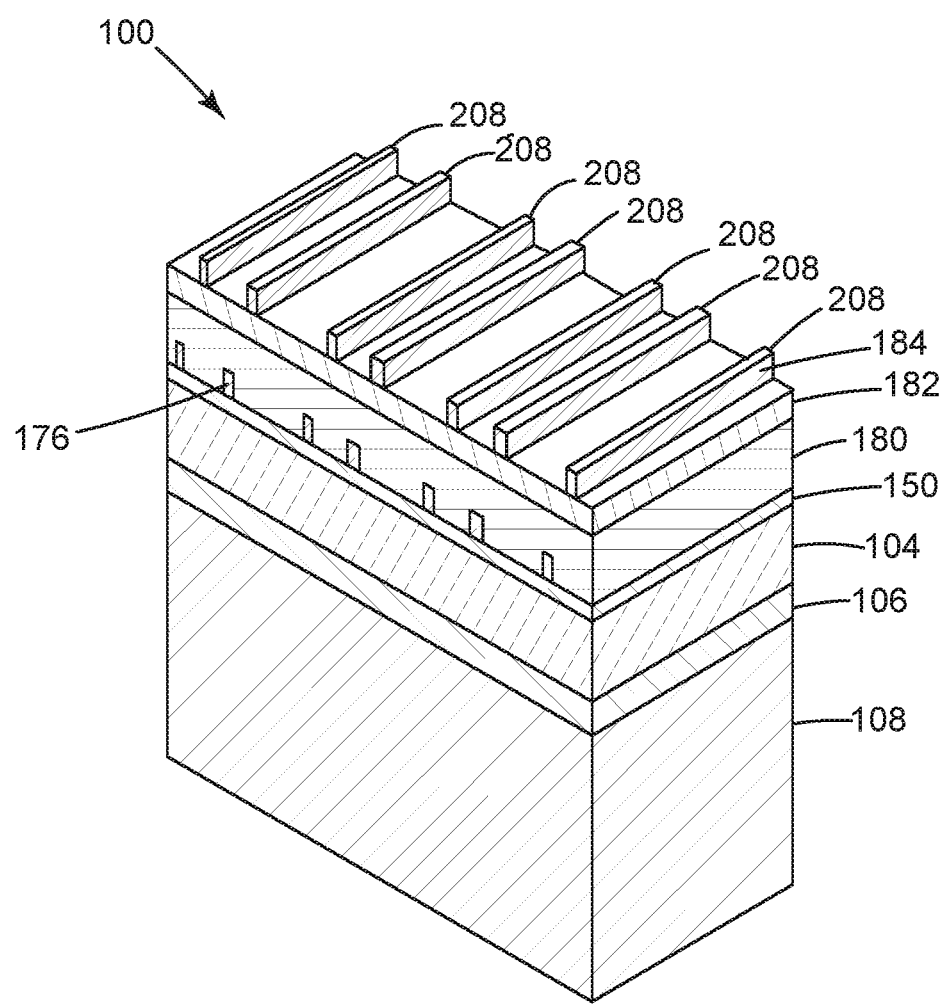
FIG. 20 is a perspective view of the structure of FIG. 19 having the remnants of the second spacer layer removed in accordance with the present invention.

Referring to FIG. 20, next the remnants of the SiO2 second mandrel spacer layer 204 are removed, leaving just the second mandrel spacers 208 patterned into the aSi second memorization layer 184. This can be done by such well know processes as wet etching or similar.

Figure 21:
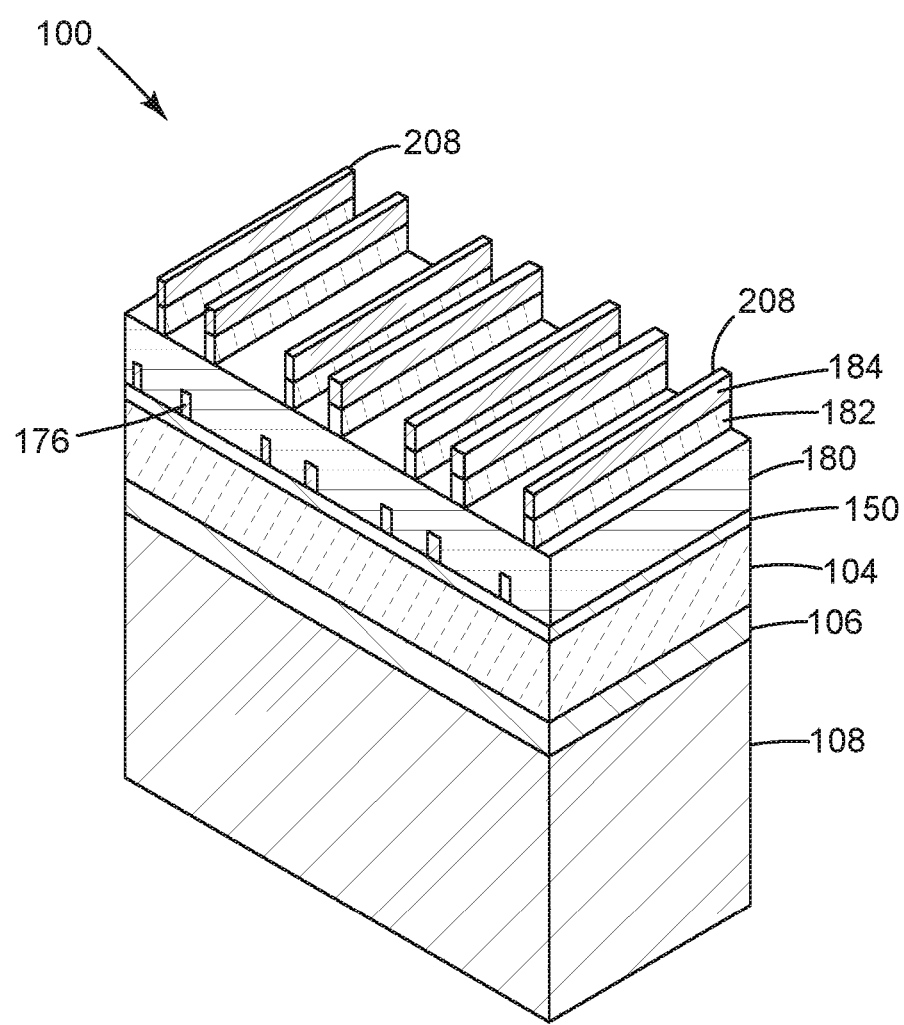
FIG. 21 is a perspective view of the structure of FIG. 20 having the second mandrel spacers patterned into the second hardmask layer in accordance with the present invention.

Referring to FIG. 21, next the second mandrel spacers 208 are patterned into the second hardmask layer 182. This can be done by an anisotropic etching process such as a SiN RIE process or similar.

Figure 22:
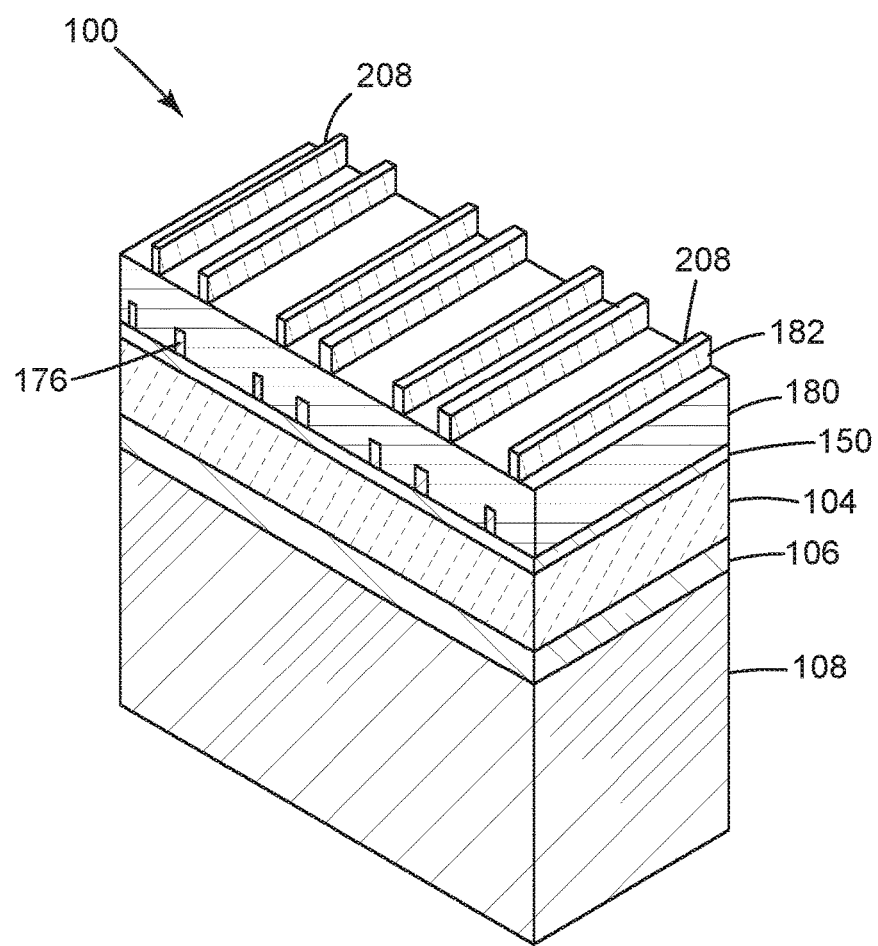
FIG. 22 is a perspective view of the structure of FIG. 21 having the remnants of the second memorization layer removed in accordance with the present invention.

Referring to FIG. 22, next the remnants of the second memorization layer 184 are removed, leaving just the second mandrel spacers 208 patterned into the second hardmask layer 182. This can be done by such well known processes as amorphous silicon wet etching or similar.

Figure 23:
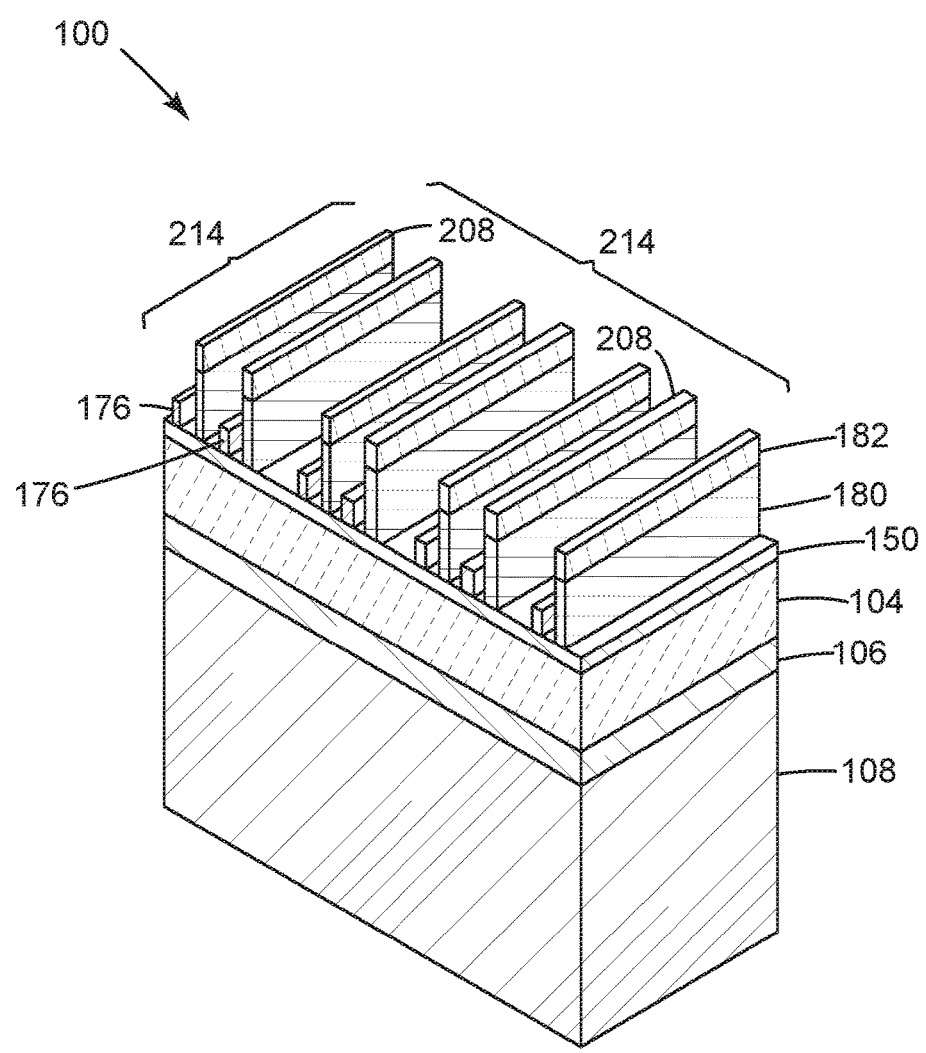
FIG. 23 is a perspective view of the structure of FIG. 22 having the SOH layer anisotropically etched down to pattern the second mandrel spacers onto the first hardmask layer and to form a cell pattern in accordance with the present invention.

Referring to FIG. 23, next the SOH layer 180 is anisotropically etched down to pattern the second mandrel spacers 208 onto the first hardmask layer 150. This can be done by a RIE process or similar.

At this stage of the process flow, the first mandrel spacers 176 and second mandrel spacers 208 are disposed over the first hardmask layer 150 and a cell pattern 214 for the cell 102 has been completed. That is, the first and second mandrel spacers 176, 208 define the $1^{st}$, $2^{nd}$, $3^{rd}$, $4^{th}$ line spacer widths 126, 128, 130, 132 of the locations of the line spacers 118, 120, 122 and 124 respectively in the pattern 214. Additionally, the distances between the $1^{st}$ and $2^{nd}$ mandrel spacers 176, 208 define the line widths 110, 112, 114, 116 and the locations of the metal lines A, B, C and D in the pattern 214.

Figure 24:
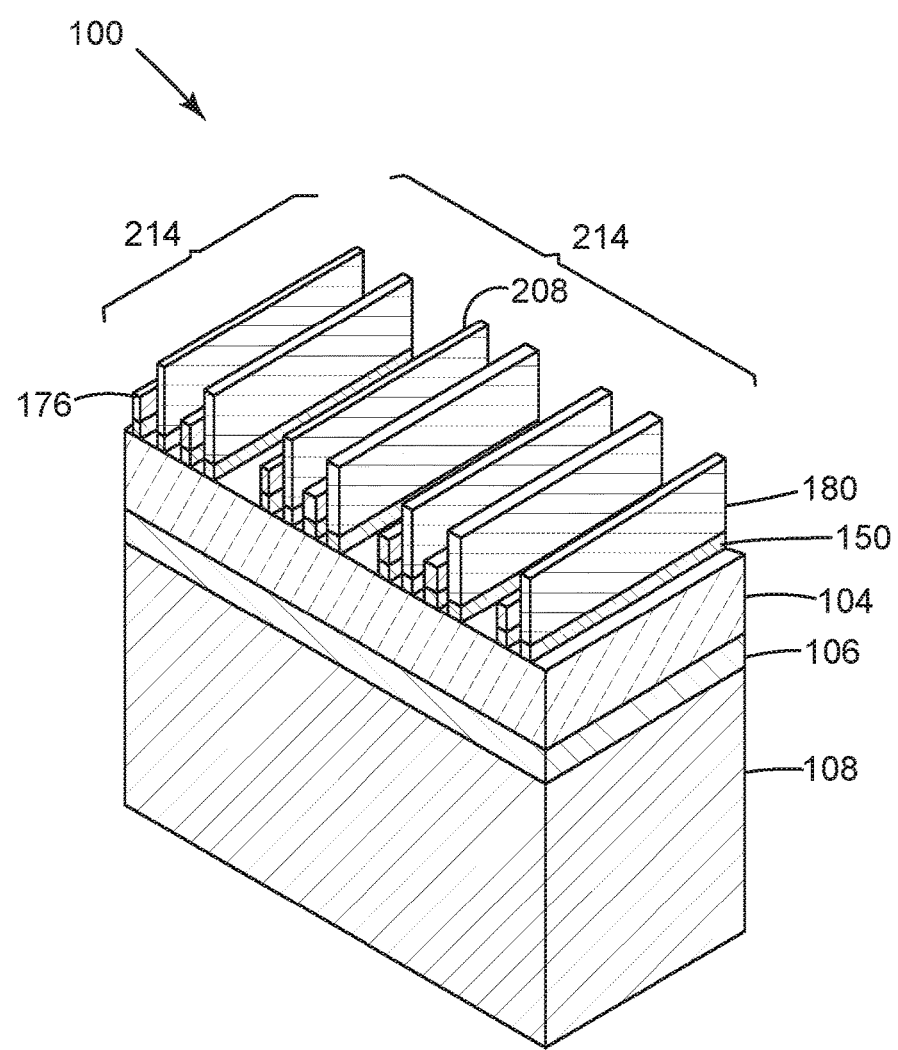
FIG. 24 is a perspective view of the structure of FIG. 23 having the first and second hardmask layers etched away to transfer the cell pattern into the first hardmask layer in accordance with the present invention.

Referring to FIG. 24, the first and second hardmask layers 150 and 182 are anisotropically etched away to transfer the pattern 214 into the first hardmask layer 150. This can be done by a SiN RIE process or similar.

Figure 25:
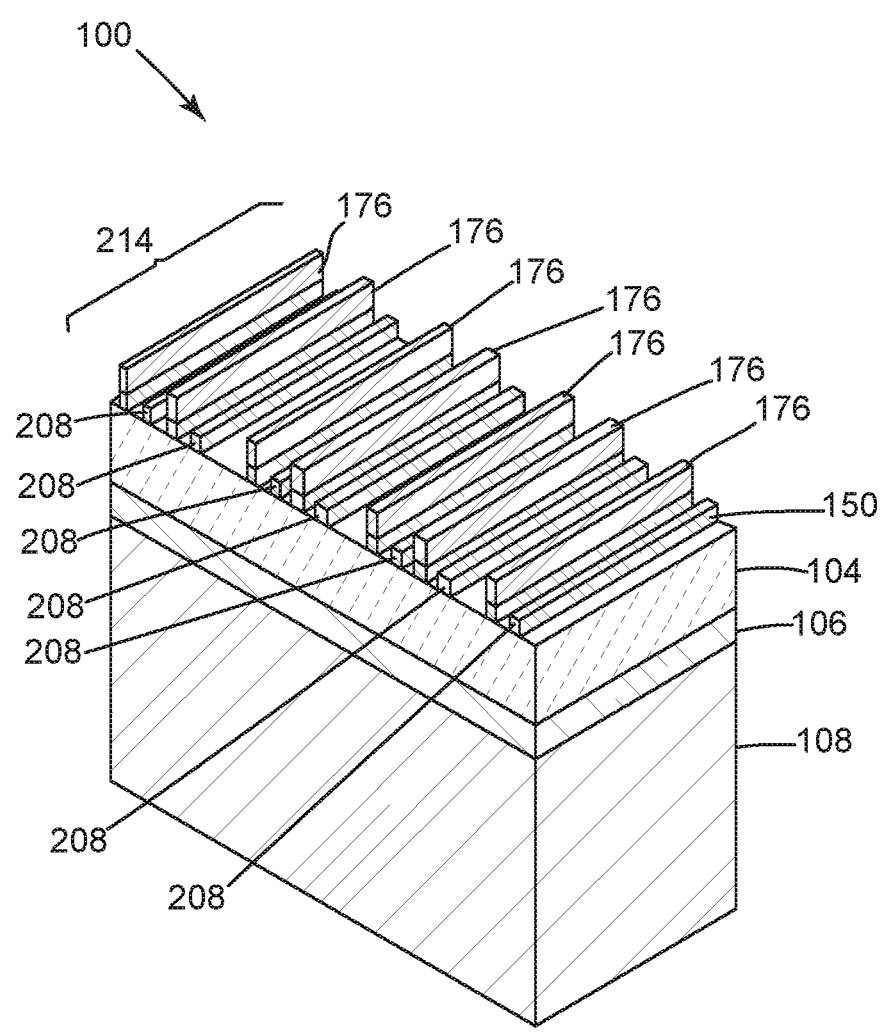
FIG. 25 is a perspective view of the structure of FIG. 24 having the remnants of the SOH layer removed in accordance with the present invention.

Referring to FIG. 25, the SOH layer is next removed. This can be done by a wet etch or similar.

Figure 26:
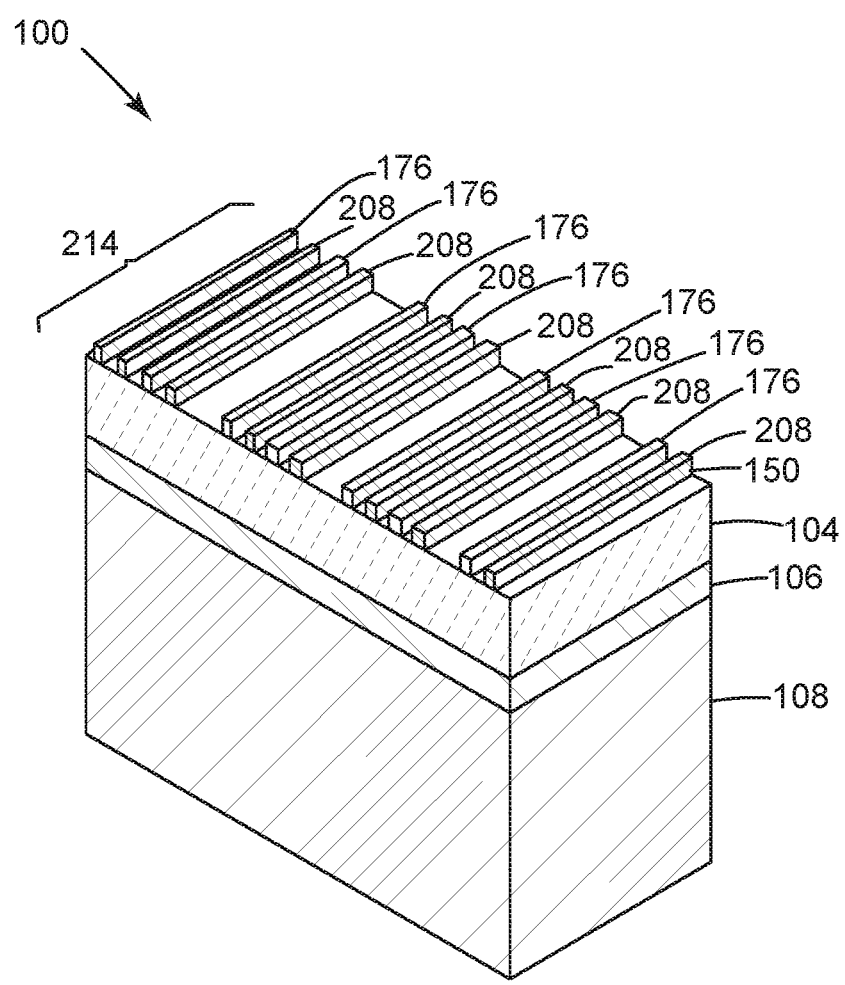
FIG. 26 is a perspective view of the structure of FIG. 25 having the remnants of the first memorization layer removed in accordance with the present invention.

Referring to FIG. 26, remnants of the first memorization layer 152 are removed leaving the pattern 214 of alternating first mandrel spacers 176 and second mandrel spacers 208 formed exclusively in the first hardmask layer 150. This can be done by an aSi wet etch or similar.

Figure 27:
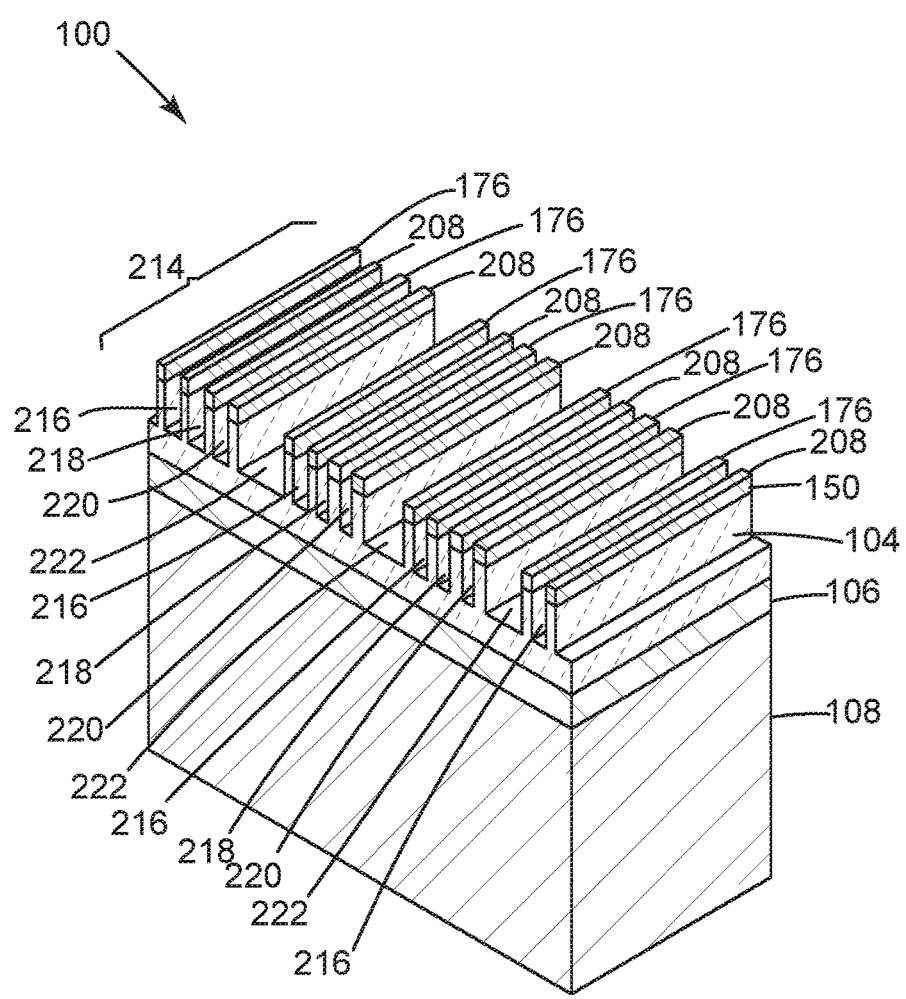
FIG. 27 is a perspective view of the structure of FIG. 26 having the dielectric layer anisotropically etched to form trenches in accordance with the present invention.

Referring to FIG. 27, the dielectric layer 104 is next anisotropically etched from the pattern 214 of alternating $1^{st}$ and $2^{nd}$ mandrel spacers 176, 208 to form a series of A trenches 216, B trenches 218, C trenches 220 and D trenches 222. This can be done by an RIE process of similar. The A, B, C and D trenches will be used to form the A, B, C and D metal lines during subsequent metallization as is well known.

Figure 28:
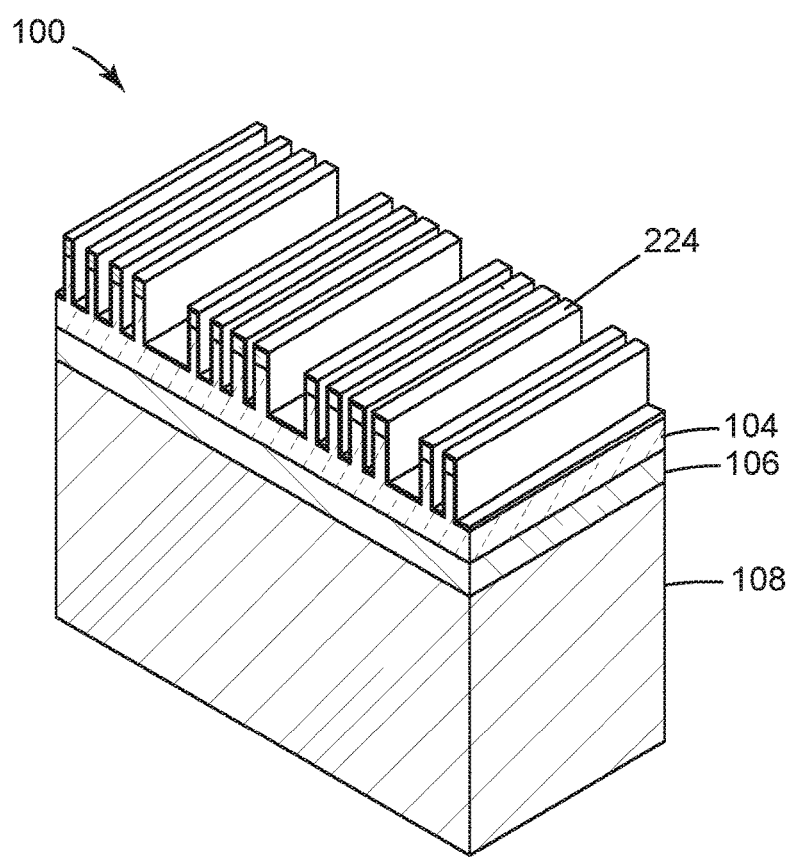
FIG. 28 is a perspective view of the structure of FIG. 27 having a barrier layer disposed thereon in accordance with the present invention.

Referring to FIG. 28, a well know barrier layer 224 is next deposited onto the structure 100 to coat the dielectric layer 104 during metallization. This can be done by ALD or similar. The barrier layer may be composed of one or more of the following: Tantalum (Ta), Tantalum Nitride (TaN), Ruthenium (Ru), Cobalt (Co), Manganese Nitride (MnN).

Figure 29:
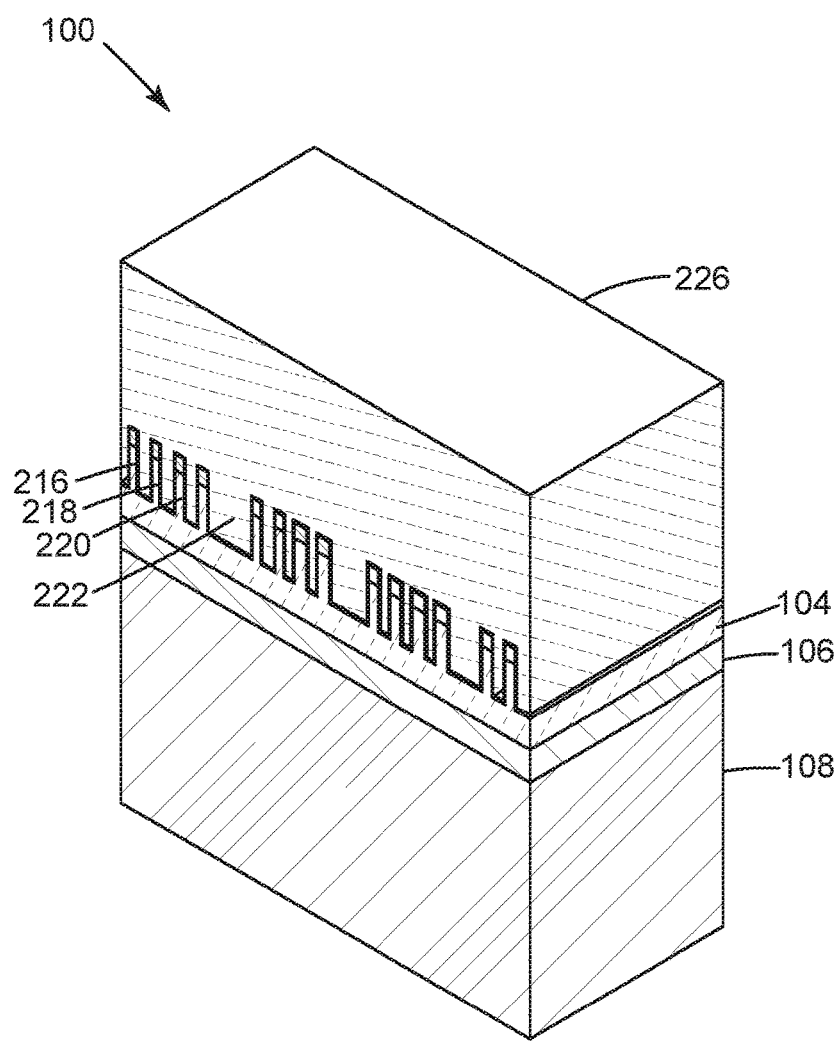
FIG. 29 is a perspective view of the structure of FIG. 28 having a metal layer disposed thereon in accordance with the present invention.

Referring to FIG. 29, a metal layer 226 is next disposed over the structure 100 to fill in the trenches 216, 218, 220 and 222. This can be done by PVD, CVD or electroless metal plating or similar. The metal layer 226 may be composed of tungsten, copper, cobalt, ruthenium or similar.

Figure 30A:
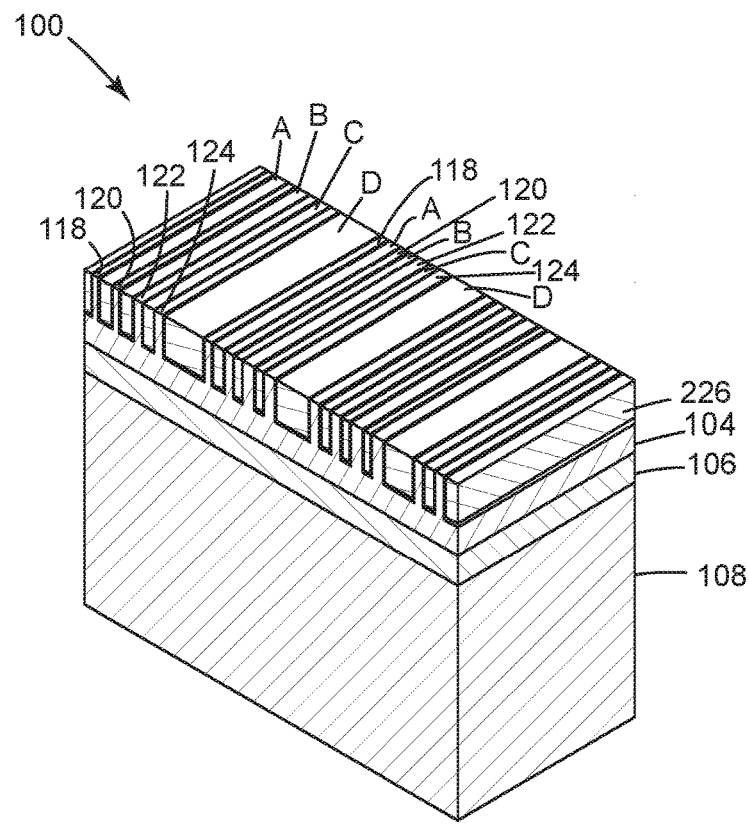
FIG. 30A is a perspective view of the structure of FIG. 29 having the metal layer planarized to complete the formation of the interconnect cells in accordance with the present invention.
Figure 30B:
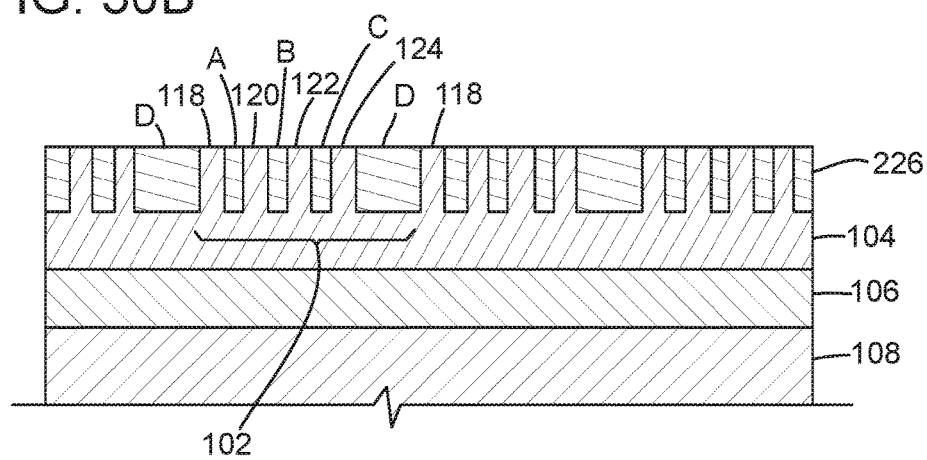
FIG. 30B is a cross-sectional view of FIG. 30A in accordance with the present invention.

Referring to FIGS. 30A and 30B, perspective and cross-sectional views of the finalized cells 102 formed into structure 100 are shown. At this stage of the process flow, the metal layer has been planarized down to the dielectric layer 104 to finalize the formation of cells 102. This may be done by chemical mechanical polishing or similar.

As can be seen, the cells 102 now includes the fully formed signal metal lines A, B and C. Additionally, each cell 102 include one power line D. The metal lines A, B, C and D are separated by fully formed line spacers 118, 120, 122 and 124. As discussed in FIG. 1, the lines spacers 118, 120, 122 and 124 are substantially equal to each other and to the minimum spacer width 140. Advantageously, the line spacers are not subject to lithographic variation.

Also, the metal signal lines A, B and C are set substantially equal to each other and to the minimum line width 136. The power line D is set to be substantially equal to two signal lines plus one line spacer. Advantageously, the widths of the metal lines A, B, C and D may vary depending on performance specifications as long as they take into consideration worst case lithographic variation.

However, no matter what the variations of the metal line widths, the line spacers will not be affected by them. Therefore, the cell structure may be scaled down to minimum pitches of 36 nm, 32 nm, 28 nm, 26 nm or less and still be able to prevent inadvertent electrical shorting between lines.

Although the invention has been described by reference to specific embodiments, it should be understood that numerous changes may be made within the spirit and scope of the inventive concepts described. Accordingly, it is intended that the invention not be limited to the described embodiments, but that it have the full scope defined by the language of the following claims.

What is claimed is:

1. A semiconductor cell comprising:
   a dielectric layer composed of a dielectric isolation material;
   an array of four substantially parallel metal lines disposed within the dielectric layer, the metal lines having line widths that are substantially equal to or greater than a predetermined minimum line width;
   a first, a second, a third and a fourth line spacer disposed respectively between the metal lines and having the dielectric isolation material of the dielectric layer disposed therein, the line spacers having line spacer widths that are substantially equal to or greater than a predetermined minimum line spacer width adequate to provide electrical isolation between the metal lines;
   an overall cell height being substantially equal to an integer multiple of a plurality of cell tracks, each cell track being a minimum pitch of the cell, the minimum pitch defined by the minimum line width plus the minimum line spacer width, the minimum pitch being equal to or less than 36 nm; and wherein not all of the line widths are substantially equal, wherein the first and third line spacers have a substantially equal line spacer width, wherein the second and fourth line spacers have a substantially equal line spacer width, and wherein the line spacer width of the first and third line spacers is substantially different from the line spacer width of the second and fourth line spacers.

2. The semiconductor cell of claim 1 wherein the array includes at least four metal lines, the line widths of at least three metal lines being substantially equal to the predetermined minimum line width.

3. The semiconductor cell of claim 2 wherein the line width of one metal line is greater than twice the minimum line width.

4. The semiconductor cell of claim 2 wherein the line width of one metal line is substantially equal to twice the minimum line width plus a line spacer width.

5. The semiconductor cell of claim 2 wherein three of the metal lines are signal lines and one of the metal lines is a power line.

6. The semiconductor cell of claim 1 wherein every other line spacer width is equal to within plus or minus 2 nanometers.

7. The semiconductor cell of claim 1 wherein the minimum line width is greater than or equal to 12 nm and has a tolerance that is greater than or equal to plus or minus 4 nm.

8. The semiconductor cell of claim 1 wherein the minimum pitch is equal to or less than one of 32 nm pitch, 28 nm pitch and 26 nm pitch.

\* \* \* \* \*